United States Patent
Nakagawa

(10) Patent No.: US 7,750,828 B2
(45) Date of Patent: *Jul. 6, 2010

(54) SYSTEMS AND METHODS FOR ENCODING AND DECODING DATA USING SELECTIVE SUBSTITUTION OF CONVERSION TABLE

(75) Inventor: Toshiyuki Nakagawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/789,107

(22) Filed: Apr. 23, 2007

(65) Prior Publication Data

US 2007/0252738 A1   Nov. 1, 2007

(30) Foreign Application Priority Data

Apr. 28, 2006   (JP) .............................. 2006-126316

(51) Int. Cl.
*H03M 7/00* (2006.01)
(52) U.S. Cl. ......................................... 341/59; 375/240
(58) Field of Classification Search ............. 341/50–70; 375/240
See application file for complete search history.

(56) References Cited

U.S. PATENT DOCUMENTS

| | | | | |
|---|---|---|---|---|
| 5,579,003 A | * | 11/1996 | Hirayama et al. | 341/59 |
| 6,445,313 B2 | * | 9/2002 | Ahn | 341/59 |
| 7,158,060 B2 | * | 1/2007 | Kahlman et al. | 341/67 |
| 7,333,033 B2 | * | 2/2008 | Nakagawa | 341/59 |
| 7,336,207 B2 | * | 2/2008 | Nakagawa | 341/59 |

FOREIGN PATENT DOCUMENTS

| | | |
|---|---|---|
| JP | HEI 6 197024 | 7/1994 |
| JP | HEI 11 346154 | 12/1999 |

* cited by examiner

*Primary Examiner*—Lam T Mai
(74) *Attorney, Agent, or Firm*—Robert J. Depke; Rockey, Depke & Lyons, LLC

(57) ABSTRACT

Systems and methods for encoding and decoding data utilize selective substitution of a conversion table for converting data having a basic data length of m bits into a variable length code (d, k; m, n) having a minimum run of d (d>0), a maximum run length of k and a basic codeword length of n bits, wherein the systems and methods use a basic conversion table and a substitute conversion table for converting the data. The selective substitution of the conversion table in a preferred exemplary embodiment is based on control information of a data string and/or a variable length code string.

24 Claims, 15 Drawing Sheets

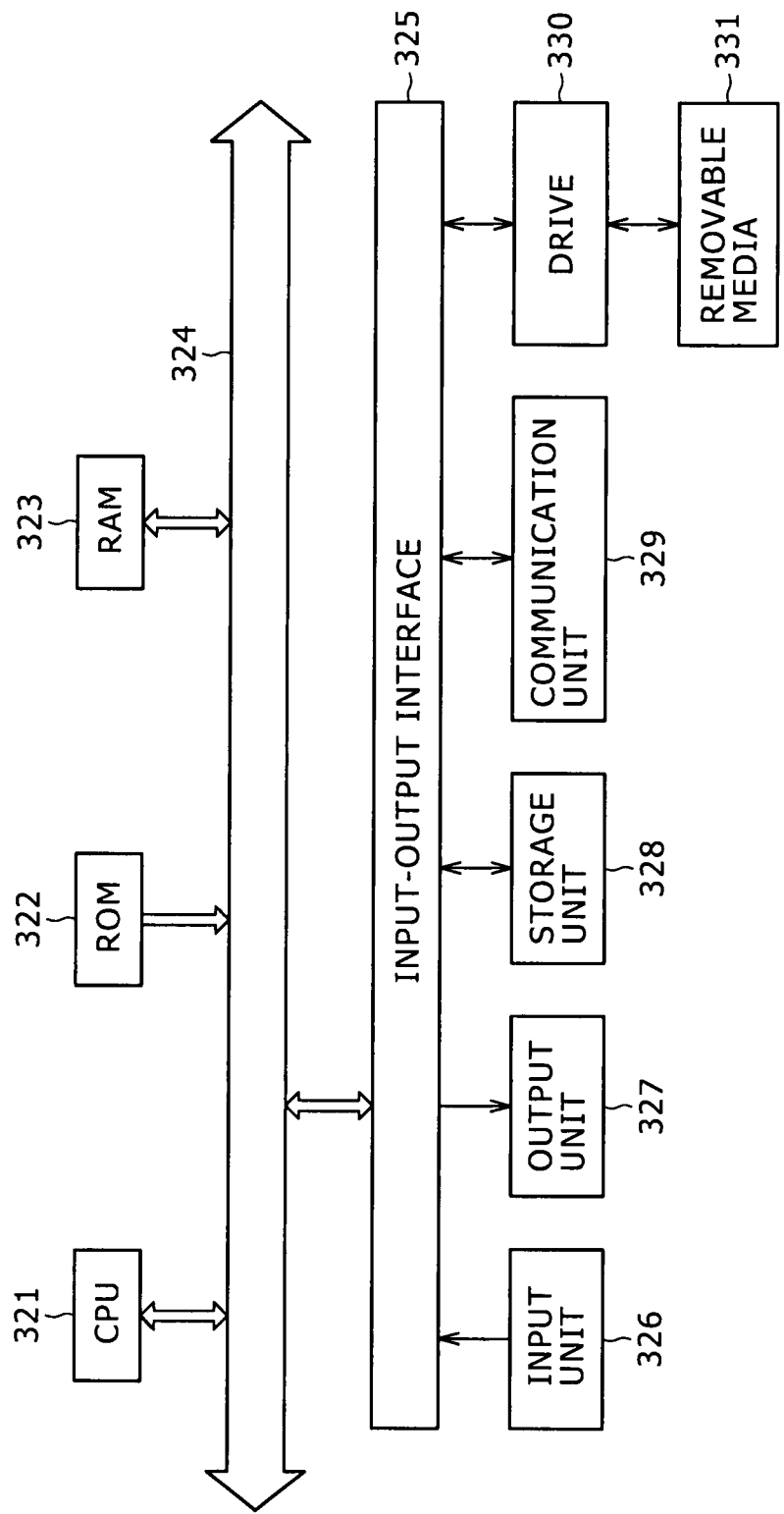

SYSTEMS AND METHODS FOR ENCODING AND DECODING DATA USING SELECTIVE SUBSTITUTION OF CONVERSION TABLE

CROSS REFERENCES TO RELATED APPLICATIONS

The present invention contains subject matter related to Japanese Patent Application JP 2006-126316 filed with the Japan Patent Office on Apr. 28, 2006, the entire contents of which being incorporated herein by reference.

BACKGROUND OF THE INVENTION

1. Field of the Invention

The present invention relates to a device and a method for modulation, a program, and a recording medium, and particularly to a device and a method for modulation, a program, and a recording medium that can provide reproduction compatibility to another device.

2. Description of the Related Art

When data is to be transmitted to a predetermined transmission line or to be recorded onto a recording medium such for example as a magnetic disk, an optical disk, or a magneto-optical disk, the data is modulated to become suitable for the transmission line or the recording medium. Known as one of methods of such modulation is a block code. The block code blocks a data string into units (hereinafter referred to as data words) each including m×i bits, and converts the data words to codewords each including n×i bits according to an appropriate code rule. When i=1, this code is fixed length code. When a plurality of values can be selected for i, that is, a predetermined i in a range of one to $i_{max}$ (a maximum of i), and then conversion is performed, the code is variable length code. The block-coded code is expressed as variable length code (d, k; m, n; r).

In this code, i is referred to as a constraint length, and $i_{max}$ is r (maximum constraint length). d denotes for example a minimum number of consecutive "0"s inserted between successive "1"s, that is, a minimum run of "0"s. k denotes for example a maximum number of consecutive "0"s inserted between successive "1"s, that is, a maximum run of "0"s.

When codewords obtained as described above are to be recorded onto an optical disk, a magneto-optical disk or the like, in the case of a compact disk (CD) or a Mini-Disc (MD)®, for example, a variable length code string is subjected to NRZI (Non Return to Zero Inverted) modulation, in which inversion is performed for "1" and inversion is not performed for "0", and recording is performed on the basis of the NRZI-modulated variable length code (hereinafter referred to as a recording waveform string). This recording is referred to as mark edge recording. On the other hand, in the case of an ISO-standard 3.5-inch magneto-optical disk with a capacity of 230 MB or the like, a code string resulting from recording modulation is recorded as it is without being subjected to NRZI modulation. This recording is referred to as mark position recording. The mark edge recording is often used for current recording media, which have been increased in recording density.

Letting Tmin be a minimum inversion interval of the recording waveform string and Tmax be a maximum inversion interval of the recording waveform string, a longer minimum inversion interval Tmin, or a larger minimum run d is preferred to perform high density recording in a linear velocity direction. From a viewpoint of clock reproduction, a shorter maximum inversion interval Tmax, or a smaller maximum run k is preferable. When overwriting characteristics are considered, it is preferable that Tmax/Tmin be smaller. Further, it is important from a viewpoint of jitter and S/N that a detection window width Tw=m/n be large, for example. Thus, various modulating methods have been proposed in light of conditions of media, and put to practical use.

Specific modulating systems proposed or actually used for optical disks, magnetic disks, magneto-optical disks, and the like are as follows. An EFM code (also denoted as (2, 10; 8, 17; 1)) used for CDs and MDs, an 8-16 code (also denoted as (2, 10; 1, 2; 1)) used for DVDs (Digital Versatile Disks), and RLL(2, 7) (also denoted as (2, 7; m, n; r)) used for PDs (120 mm and a capacity of 650 MB) are RLL codes with a minimum run d=2. RLL(1, 7) (also denoted as (1, 7; 2, 3; r)) used for MD-DATA2 or an ISO-standard 3.5-inch MO (a capacity of 640 MB) is an RLL code with a minimum run d=1. In addition, recording and reproduction disk devices for optical disks, magneto-optical disks and the like having high recording densities, which are currently being developed and studied, often use an RLL code (Run Length Limited code) with a minimum run d=1, in which the size of a smallest mark and conversion efficiency are balanced.

A modulation table of the variable length RLL (1, 7) code is for example as follows.

TABLE 1

| RLL(1, 7): (d, k; m, n; r) = (1, 7; 2, 3; 2) | |
|---|---|
| Data Pattern | Code Pattern |
| i = 1   11 | 00x |
| 10 | 010 |
| 01 | 10x |
| i = 2   0011 | 000 00x |
| 0010 | 000 010 |
| 0001 | 100 00x |
| 0000 | 100 010 |

A symbol x in the modulation table is "1" when a following channel bit is "0", and is "0" when the following channel bit is "1". The maximum constraint length r is two.

Parameters of variable length RLL (1, 7) are (1, 7; 2, 3; 2). Letting T be a bit interval of the recording waveform string, the minimum inversion interval Tmin expressed by (d+1)T is 2 (=1+1) T. Letting Tdata be a bit interval of the data string, the minimum inversion interval Tmin expressed by (m/n)×2 is 1.33 (=(⅔)×2) Tdata. The maximum inversion interval Tmax expressed by (k+1)T is Tmax=8 (=7+1) T (=(m/n)×8 Tdata=(⅔)×8 Tdata=5.33 Tdata). The detection window width Tw is expressed by (m/n)×Tdata. The value of the detection window width Tw is Tw=0.67 (=⅔) Tdata.

In a channel bit string resulting from modulation in accordance with the RLL (1, 7) of Table 1, 2T, which is Tmin, occurs most frequently, and the frequencies of occurrences of 3T, 4T, 5T, 6T . . . are decreased in that order. Repetition of 2T as the minimum run (Tmin), that is, frequent occurrence of edge information in short cycles is often advantageous for clock reproduction.

However, in recording and reproduction of an optical disk, for example, as recording linear density is further increased, an error tends to occur at parts of the minimum run. This is because in disk reproduction, a waveform output of the minimum run is smaller than waveform outputs of other runs and is thus easily affected by for example a defocus and a tangential tilt. In addition, recording and reproduction of successive minimum marks at a high recording linear density is easily affected by disturbances such as noise and the like. Thus, a data reproduction error tends to occur. As a pattern of the data reproduction error at this time, an error in which an entire length of successive smallest marks from a first edge to a last edge is shifted can occur. That is, the length of a bit error that occurs extends from a start to an end of the section of successive occurrences of the minimum run. Therefore a problem of a long error propagation occurs.

For stabilization in recording and reproducing data at a high linear density, limiting successive occurrences of the minimum run is effective.

When data is to be recorded onto a recording medium or the data is to be transmitted, coding modulation suitable for the recording medium or a transmission line is performed. When modulation codes include a low-frequency component, for example, variations in various error signals for a tracking error and the like in servo control of the disk device tend to occur, or jitter tends to occur. It is therefore desirable to suppress the low-frequency component of the modulation codes as much as possible.

As a method for suppressing the low-frequency component, there is DSV (Digital Sum Value) control. When a channel bit string is subjected to NRZI modulation (that is, level coding) to be converted into a recording code string, and codes are added up with "1" in the bit string (data symbols) taken as a code +1 and "0" in the bit string taken as a code −1, DSV represents a total sum of the added-up codes. The DSV serves as an indicator of the low-frequency component of the recording code string. Decreasing the absolute values of positive and negative fluctuations in the DSV, that is, performing DSV control eliminates a direct-current component of the recording code string and suppresses the low-frequency component.

DSV control is not applied to modulation codes generated according to the variable length RLL (1, 7) table shown as Table 1. DSV control in such a case is achieved by performing a DSV calculation at predetermined intervals in a coded string (channel bit string) after modulation and inserting predetermined DSV control bits in the coded string (channel bit string) (Japanese Patent Laid-Open No. Hei 6-197024 referred to as Patent Document 1 hereinafter, for example).

The number of DSV control bits to be inserted in the channel bit string is determined by the minimum run d. When d=1, and when DSV control bits are to be inserted at an arbitrary position of codewords in such a manner as to keep the minimum run, two (=d+1) channel bits are necessary. When DSV control bits are to be inserted at an arbitrary position of codewords in such a manner as to keep the maximum run, four (=2×(d+1)) channel bits are necessary. When DSV control is to be performed with fewer channel bits than these channel bits, DSV control may not be achieved, depending on a preceding pattern and a succeeding pattern between which the channel bits are interposed.

In the RLL(1, 7) code with (d, k; m, n)=(1, 7; 2, 3), when the above DSV control bits are converted into data with the conversion ratio, 4 channel bits×2/3=8/3=about 2.67 data pieces (2.67 Tdata)

The DSV control bits are basically redundant bits. Thus, from a viewpoint of efficiency of code conversion, it is desirable to reduce the number of DSV control bits as much as possible.

Further, it is desirable not to allow the minimum run d and the maximum run k to be changed by inserted DSV control bits. This is because a change in (d, k) affects recording and reproduction characteristics.

In an actual RLL code, however, the minimum run have to be kept because the minimum run greatly affects recording and reproduction characteristics, but the maximum run is not necessarily kept. In some cases, there is a format in which a pattern that breaks the maximum run is used as a synchronizing pattern. For example, while a maximum run in the 8-16 code of DVD (Digital Versatile Disk) is 11 T, 14 T exceeding the maximum run is given in the part of a synchronizing pattern to enhance a capability of detecting the synchronizing pattern.

On the basis of the above, the present inventor et al. have previously proposed a 1,7PP code of Table 2 as a modulation system with (d, k)=(1, 7) which system is ready for high recording densities (see Japanese Patent Laid-Open No. Hei 11-346154 referred to as Patent Document 2 hereinafter, for example).

TABLE 2

1,7PP: (d, k; m, n; r) = (1, 7; 2, 3; 4)

| Data Pattern | Code Pattern |
| --- | --- |
| i = 1   11 | *0* |
| 10 | 001 |
| 01 | 010 |
| i = 2   0011 | 010 100 |
| 0010 | 010 000 |
| 0001 | 000 100 |
| i = 3   000011 | 00 100 100 |
| 000010 | 000 100 000 |
| 000001 | 010 100 100 |
| 000000 | 010 100 000 |
| i = 3   110111 | 001 000 000 (next 010) |
| i = 4   00001000 | 000 100 100 100 |
| 00000000 | 010 100 100 100 |
| if xx1 then *0* = 000 | |
| xx0 then *0* = 101 | |

Sync & Termination

01 001 000 000 001 000 000 001 (24 channel bits)

=0 not terminate case

=1 terminate case

| Termination Table | |
| --- | --- |
| 00 | 000 |
| 0000 | 010 100 |
| 110111 | 001 000 000 (next 010): |
| When next channel bits are '010', | |
| convert '11 01 11' to '001 000 000'. | |

The modulation table of Table 2 includes, as conversion patterns, basic patterns without which conversion processing may not be carried out (conversion patterns composed of data patterns (11) to (000000)), substitution patterns without which conversion processing can be carried out, but with which more effective conversion processing can be carried out (conversion patterns composed of data patterns (110111), (00001000), and (00000000)), and terminating patterns for terminating a data string at an arbitrary position (conversion patterns composed of data patterns (00) and (0000)).

In addition, Table 2 includes an indeterminate code (a code denoted by a symbol *) as an element of a basic pattern, with a minimum run d=1 and a maximum run k=7. The indeterminate code is set to "0" or "1" so as to keep the minimum run d and the maximum run k regardless of an immediately preceding codeword and an immediately succeeding codeword. Specifically, in Table 2, when a two-piece data pattern to be converted is (11), a code pattern "000" or "101" is selected depending on an immediately preceding codeword string (channel bit string), and the data pattern to be converted is converted to one of the code patterns "000" and "101". For example, when one channel bit of the immediately preceding codeword string is "1", the data pattern (11) is converted to the code pattern "000" to keep the minimum run d. When one channel bit of the immediately preceding codeword string is "0", the data pattern (11) is converted to the code pattern "101" to keep the maximum run k.

The basic patterns of the modulation table of Table 2 have a variable length structure. That is, the number of basic patterns at a constraint length i=1 is three (the three patterns *0*, 001, and 010), which is smaller than a required number of four ($2^m=2^2=4$). As a result, in converting data strings, there are data strings that may not be converted with a constraint length i=1. After all, in order to convert all data strings in Table 2 (for Table 2 to hold as a modulation table), it is necessary to refer to basic patterns up to a constraint length i=3.

In addition, the modulation table of Table 2 has a substitution pattern for limiting successive occurrences of the minimum run d. Thus, when a data pattern is (110111), a succeeding codeword string is further referred to, and when the succeeding codeword string is "010", the data pattern is replaced with the six-piece-data pattern code pattern "001 000 000". When the succeeding code string is other than "010", the data pattern is converted as units of two-piece data ((11), (01), and (11)) into a code pattern, and hence converted into a codeword "*0* 010 *0*". Thus, successive occurrences of the minimum run in a codeword string resulting from conversion of data are limited, and the minimum run is repeated six times at a maximum.

The modulation table of Table 2 has a maximum constraint length r=4. Conversion patterns with a constraint length i=4 are formed by substitution patterns (maximum run guaranteeing patterns) for realizing the maximum run k=7. Specifically, the data pattern (00001000) is converted to the code pattern "000 100 100 100", and the data pattern (00000000) is converted to the code pattern "010 100 100 100". Also in this case, the minimum run d=1 is kept.

Further, in Table 2, when termination is effected at an arbitrary position of a data string to insert a synchronizing pattern, and when the data string has (00) or (0000) at a terminating position, a termination pattern is used. The inserted synchronizing pattern has a first codeword as a termination pattern use identifying bit. When a termination pattern is used, the first codeword of the immediately succeeding synchronizing pattern string is "1". When no termination pattern is used, the first codeword is "0". Incidentally, the synchronizing pattern in Table 2 is formed by a total of 24 codewords including the above-mentioned termination pattern use identifying bit and two repetitive code patterns with k=8 exceeding the maximum run k=7 for detection of the synchronizing pattern.

The conversion patterns in Table 2 have a conversion rule that a remainder when the number of "1"s as an element of a data pattern is divided by two and a remainder when the number of "1"s as an element of a converted code pattern is divided by two be both 1 or 0 and thus equal to each other (both elements corresponding to each other have an odd number of "1"s or an even number of "1"s). For example, the data pattern (000001) of the conversion patterns corresponds to the code pattern "010 100 100". The number of "1"s as an element of the data pattern is one, and the number of "1"s as an element of the corresponding code pattern is three. A remainder when the number of "1"s as an element of the data pattern is divided by two and a remainder when the number of "1"s as an element of the corresponding code pattern is divided by two are both one (an odd number) and thus match each other. Similarly, the data pattern (000000) of the conversion patterns corresponds to the code pattern "010 100 000". The number of "1"s as an element of the data pattern is zero, and the number of "1"s as an element of the corresponding code pattern is two. A remainder when the number of "1"s as an element of the data pattern is divided by two and a remainder when the number of "1"s as an element of the corresponding code pattern is divided by two are both zero (an even number) and thus match each other.

A method of performing DSV control will next be described. Existing DSV control when the DSV control is not performed in a modulation table as in the RLL(1, 7) code of Table 1 is performed by adding at least (d+1) DSV control bits at predetermined intervals to a channel bit string after modulation of a data string, for example. While DSV control can be performed in a modulation table such as Table 2 in the same manner as the existing DSV control, DSV control can be performed more efficiently by utilizing relations between the data patterns and the code patterns in Table 2. Specifically, when the modulation table has the conversion rule that a remainder when the number of "1"s as an element of a data pattern is divided by two and a remainder when the number of "1"s as an element of a code pattern is divided by two be both 1 or 0 and thus the same, insertion of a DSV control bit of "1" representing "inversion" or a DSV control bit of "0" representing "non-inversion" in a channel bit string as described above is equivalent to insertion of a DSV control bit of (1) for "inversion" or a DSV control bit of (0) for "non-inversion" in a data bit string.

When a DSV control bit is inserted at the rear of a sequence of three bits (001) to be subjected to data conversion in Table 2, for example, data is (001-x) (x is one bit of "0" or "1"). When "0" is assigned to x, the following conversion is performed in the modulation table of Table 2.

| Data Pattern | Code Pattern |
| --- | --- |
| 0010 | 010 000 |

When "1" is assigned to x, the following conversion is performed in the modulation table of Table 2.

| Data Pattern | Code Pattern |
| --- | --- |
| 0011 | 010 100 |

The codeword strings are subjected to NRZI modulation, and thereby the following level code strings are generated.

| Data Pattern | Code Pattern | Level Code String |
| --- | --- | --- |
| 0010 | 010 000 | 011111 |
| 0011 | 010 100 | 011000 |

The last three bits of the level code strings are in inverted relation to each other. This means that DSV control can be performed also in a data string by selecting (1) and (0) as the DSV control bit x.

Considering redundancy due to DSV control, performing DSV control with one bit in a data string is equivalent to performing DSV control with 1.5 channel bits when expressed in terms of a channel bit string on the basis of the conversion ratio (m:n=2:3) of Table 2. On the other hand, to perform DSV control in an RLL(1, 7) table such as Table 1, DSV control needs to be performed in a channel bit string. At this time, at least two channel bits may be required to keep the minimum run, and redundancy is increased as compared with the DSV control of Table 2. In other words, with the table structure of Table 2, DSV control is performed in a data string, and therefore DSV control can be performed efficiently.

The modulation table of Table 2 ready for high recording densities which table has the minimum run and the maximum run (d, k)=(1, 7) as described above is employed as a format of Blu-ray Disc ReWritable ver1.0® as a high-density optical disk system, for example.

For still higher recording densities in the future, or specifically, for example, for still higher density standards for high-density optical disks, a more stable system is desired in a modulation system.

When a modulation system for implementing a more stable system with similar parameters and the configuration of a similar modulation table to those of the existing (1, 7)PP code is realized for the already commercialized Blu-ray Disc ReWritable ver1.0, existing design technology can be used, and thus a design risk at the time of hardware design can be reduced.

SUMMARY OF THE INVENTION

When a new conversion table is developed, consideration is often given to enable a new demodulating device demodulating codes converted by the new conversion table to demodulate codes converted by an existing conversion table. Conversely, however, an existing demodulating device demodulating codes converted by the existing conversion table may not demodulate codes converted by the new conversion table.

The present invention has been made in view of such a situation, and enables even an existing demodulating device to demodulate codes converted by the new conversion table.

An embodiment of the present invention is a modulating device for converting data having a basic data length of m bits into variable length code (d, k; m, n) having a minimum run of d (d>0), a maximum run of k, and a basic codeword length of n bits, wherein the modulating device is characterized by having a basic conversion table and a substitution conversion table as a conversion table, and under a condition where the substitution conversion table is to be applied, control is performed to determine whether to perform substitution pattern conversion processing based on the substitution conversion table or to perform conversion processing based on the basic conversion table instead without performing the substitution pattern conversion processing, according to control information obtained from one of a data string and a variable length code string.

The substitution conversion table can be a conversion table for limiting successive occurrences of the minimum run.

An embodiment of the present invention is a modulating method or a program for converting data having a basic data length of m bits into variable length code (d, k; m, n) having a minimum run of d (d>0), a maximum run of k, and a basic codeword length of n bits, wherein under a condition where of a basic conversion table and a substitution conversion table as a conversion table, the substitution conversion table is to be applied, control is performed to determine whether to perform substitution pattern conversion processing based on the substitution conversion table or to perform conversion processing based on the basic conversion table instead without performing the substitution pattern conversion processing, according to control information obtained from one of a data string and a variable length code string.

The program can be recorded onto a recording medium.

An embodiment of the present invention is a modulating device for converting data having a basic data length of m bits into variable length code (d, k; m, n) having a minimum run of d (d>0), a maximum run of k, and a basic codeword length of n bits, wherein the modulating device is characterized by having a basic conversion table and a substitution conversion table as a conversion table, and under a condition where the substitution conversion table is to be applied, control is performed to determine whether to perform substitution pattern conversion processing based on the substitution conversion table or to perform conversion processing based on the basic conversion table instead without performing the substitution pattern conversion processing, according to information obtained from a disk.

The substitution conversion table can be a conversion table for limiting successive occurrences of the minimum run.

The information obtained from the disk can be predetermined header information recorded in a header position on the disk.

The modulating device can further perform control to determine whether to apply the substitution pattern conversion processing for limiting successive occurrences of the minimum run according to external information.

An embodiment of the present invention is a modulating method or a program for converting data having a basic data length of m bits into variable length code (d, k; m, n) having a minimum run of d (d>0), a maximum run of k, and a basic codeword length of n bits, wherein under a condition where of a basic conversion table and a substitution conversion table as a conversion table, the substitution conversion table is to be applied, control is performed to determine whether to perform substitution pattern conversion processing based on the substitution conversion table or to perform conversion processing based on the basic conversion table instead without performing the substitution pattern conversion processing, according to information obtained from a disk.

The program can be recorded onto a recording medium.

An embodiment of the present invention is a modulating device including: first converting means for converting a part of input data which part matches a first data pattern into a corresponding first code pattern according to a first table associating the first data pattern with the first code pattern; second converting means for converting a part of the input data which part matches a second data pattern into a corresponding second code pattern according to a second table associating the second data pattern with the second code pattern; and selecting means for selecting one of the first code pattern and the second code pattern on a basis of frequency of use of the second code pattern converted according to the second table.

The modulating device can further include detection processing means for detecting the frequency of use and generating control information for controlling selection of the second code pattern, and the selecting means can make the selection on a basis of the control information.

The detection processing means can generate the control information for permitting conversion processing for the second code pattern when the frequency of use does not exceed a predetermined count set in advance, and prohibiting the conversion processing for the second code pattern when the frequency of use exceeds the predetermined count.

The detection processing means can set the predetermined count such that the predetermined count is limited in a range in which error correction is possible.

The detection processing means can detect the frequency of use of the second code pattern within a predetermined ECC block, and limit the frequency of use such that the frequency of use does not exceed a predetermined reference value corresponding to a value within a range in which error correction is possible within the predetermined ECC block.

The first table can be a table corresponding to another table having reproduction compatibility.

The first table as table corresponding to the other table having the reproduction compatibility can include all of a basic conversion table.

The first table as table corresponding to the other table having the reproduction compatibility can further include a substitution conversion table.

A signal converted by the modulating device can be recorded onto a recording medium.

An embodiment of the present invention is a modulating method or a program including: a first converting step of converting a part of input data which part matches a first data pattern into a corresponding first code pattern according to a first table associating the first data pattern with the first code pattern; a second converting step of converting a part of the input data which part matches a second data pattern into a corresponding second code pattern according to a second table associating the second data pattern with the second code pattern; and a selecting step of selecting one of the first code pattern and the second code pattern on a basis of frequency of use of the second code pattern converted according to the second table.

The program can be recorded onto a recording medium.

In the above-described embodiment of the present invention, under a condition where the substitution conversion table is to be applied, control is performed to determine whether to perform substitution pattern conversion processing based on the substitution conversion table or to perform conversion processing based on the basic conversion table instead without performing the substitution pattern conversion processing, according to control information obtained from one of a data string and a variable length code string.

In the above-described embodiment of the present invention, under a condition where of a basic conversion table and a substitution conversion table as a conversion table, the substitution conversion table is to be applied, control is performed to determine whether to perform substitution pattern conversion processing based on the substitution conversion table or to perform conversion processing based on the basic conversion table instead without performing the substitution pattern conversion processing, according to information obtained from a disk.

In the above-described embodiment of the present invention, a part of input data which part matches a first data pattern is converted into a corresponding first code pattern according to a first table associating the first data pattern with the first code pattern. In addition, a part of the input data which part matches a second data pattern is converted into a corresponding second code pattern according to a second table associating the second data pattern with the second code pattern. One of the first code pattern and the second code pattern is selected on a basis of frequency of use of the second code pattern converted according to the second table.

According to the above-described embodiments of the present invention, reproduction compatibility can be provided to another device. In particular, improved code can be demodulated by a device that does not essentially have a function of demodulating the improved code and which demodulates codes before the improvement.

BRIEF DESCRIPTION OF THE DRAWINGS

FIG. 15 is a block diagram showing a configuration of a personal computer.

DETAILED DESCRIPTION OF THE PREFERRED EMBODIMENTS

Preferred embodiments of the present invention will hereinafter be described. Correspondences between constitutional requirements of the present invention and embodiments described in the specification or the drawings are illustrated as follows. This description is to confirm that embodiments supporting the present invention are described in the specification or the drawings. Therefore, even when there is an embodiment described in the specification or drawings but not described here as an embodiment corresponding to a constitutional requirement of the present invention, it does not signify that the embodiment does not correspond to the constitutional requirement. Conversely, even when an embodiment is described here as corresponding to a constitutional requirement, it does not signify that the embodiment does not correspond to constitutional requirements other than that constitutional requirement.

Figure 3:
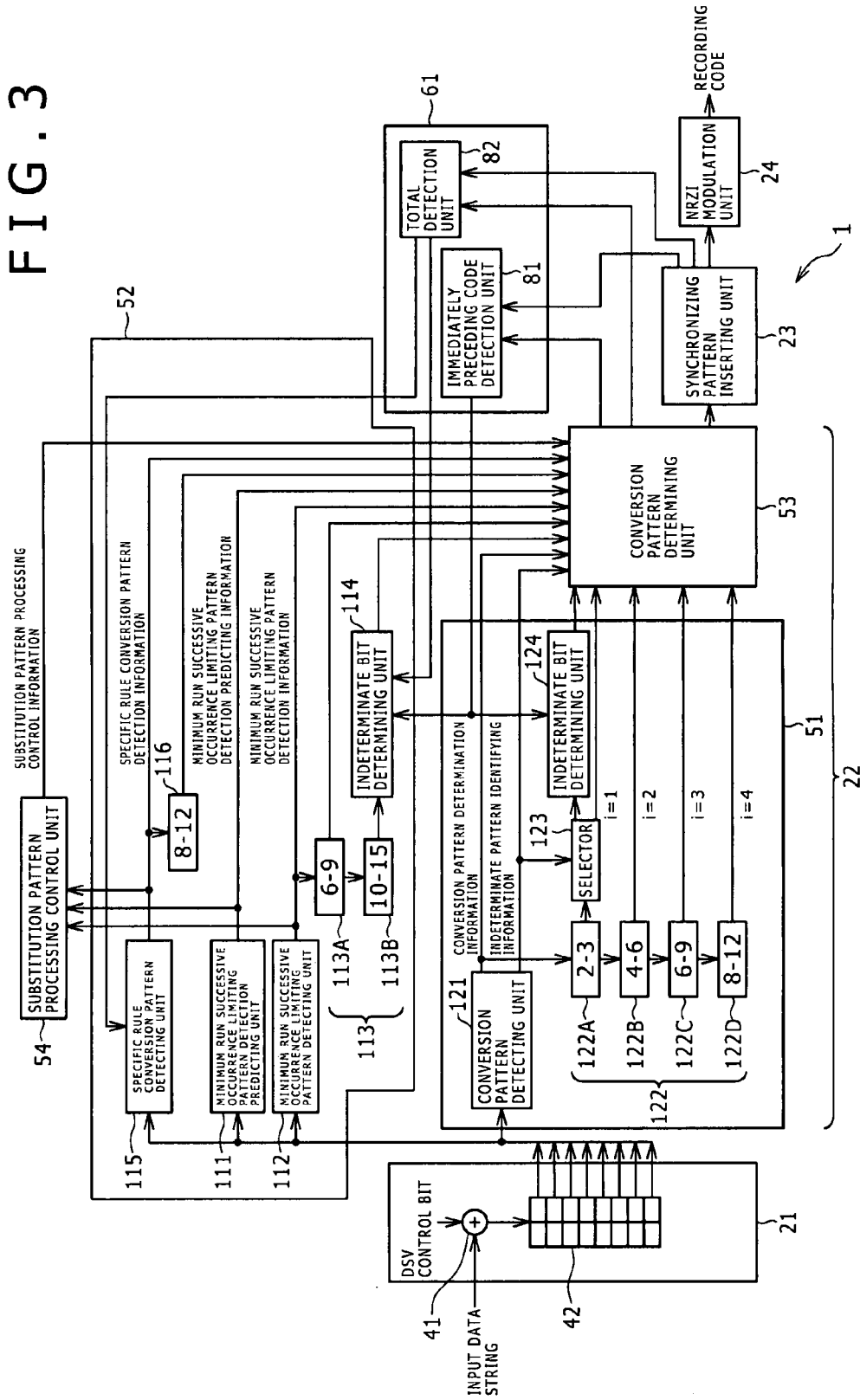
FIG. 3 is a block diagram showing a more detailed configuration of the coding device of FIG. 2.
Figure 4:
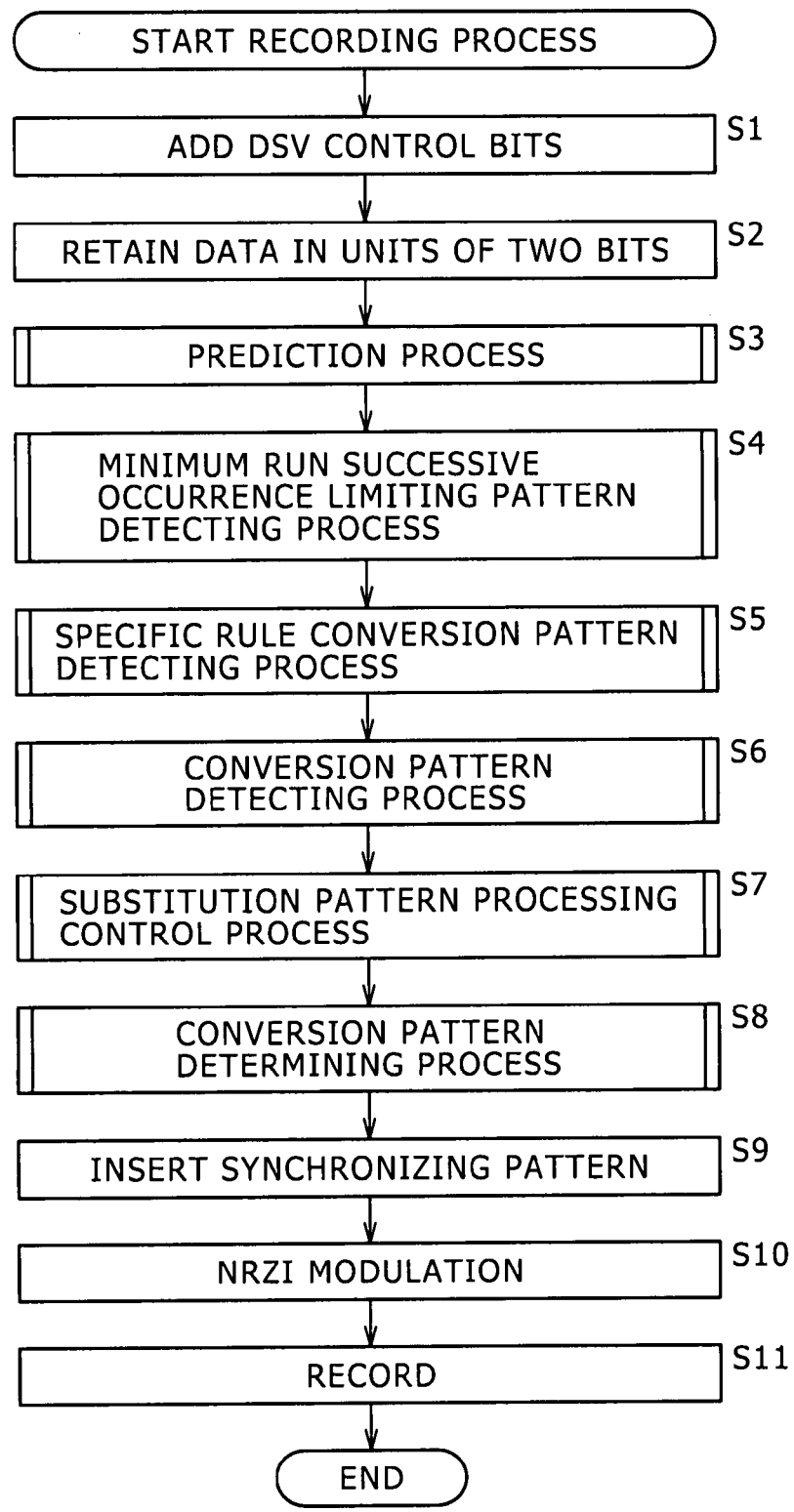
FIG. 4 is a flowchart of assistance in explaining a recording process.

An embodiment of the present invention is a modulating device (modulating device 1 in FIG. 3, for example) for converting data having a basic data length of m bits into variable length code (d, k; m, n) having a minimum run of d (d>0), a maximum run of k, and a basic codeword length of n bits, wherein the modulating device is characterized by having a basic conversion table and a substitution conversion table as a conversion table, and under a condition where the substitution conversion table is to be applied, control is performed to determine whether to perform substitution pattern conversion processing based on the substitution conversion table or to perform conversion processing based on the basic conversion table instead without performing the substitution pattern conversion processing, according to control information obtained from one of a data string and a variable length code string (for example the process of step S8 in FIG. 4 is performed).

An embodiment of the present invention is a modulating method or a program (for example a modulating method or a program performing the recording process of FIG. 4, for example) for converting data having a basic data length of m bits into variable length code (d, k; m, n) having a minimum run of d (d>0), a maximum run of k, and a basic codeword length of n bits, wherein under a condition where of a basic conversion table and a substitution conversion table as a conversion table, the substitution conversion table is to be applied, control is performed to determine whether to perform substitution pattern conversion processing based on the substitution conversion table or to perform conversion processing based on the basic conversion table instead without performing the substitution pattern conversion processing, according to control information obtained from one of a data string and a variable length code string (for example the process of step S8 in FIG. 4 is performed).

An embodiment of the present invention is a modulating device (modulating device 1 in FIG. 3, for example) for converting data having a basic data length of m bits into variable length code (d, k; m, n) having a minimum run of d (d>0), a maximum run of k, and a basic codeword length of n bits, wherein the modulating device is characterized by having a basic conversion table and a substitution conversion table as a conversion table, and under a condition where the substitution conversion table is to be applied, control is performed to determine whether to perform substitution pattern conversion processing based on the substitution conversion table or to perform conversion processing based on the basic conversion table instead without performing the substitution pattern conversion processing, according to information obtained from a disk (for example the process of step S8 in FIG. 4 is performed).

An embodiment of the present invention is a modulating method or a program (for example a modulating method or a program performing the recording process of FIG. 4, for example) for converting data having a basic data length of m bits into variable length code (d, k; m, n) having a minimum run of d (d>0), a maximum run of k, and a basic codeword length of n bits, wherein under a condition where of a basic conversion table and a substitution conversion table as a conversion table, the substitution conversion table is to be applied, control is performed to determine whether to perform substitution pattern conversion processing based on the substitution conversion table or to perform conversion processing based on the basic conversion table instead without performing the substitution pattern conversion processing, according to information obtained from a disk (for example the process of step S8 in FIG. 4 is performed).

An embodiment of the present invention is a modulating device (for example a modulating device 1 in FIG. 3) including: first converting means (for example a conversion table 122 and a minimum run successive occurrence limiting table 113A in FIG. 3) for converting a part of input data which part matches a first data pattern into a corresponding first code pattern according to a first table associating the first data pattern with the first code pattern; second converting means (for example a minimum run successive occurrence limiting table 113B and a specific rule conversion table 116 in FIG. 3) for converting a part of the input data which part matches a second data pattern into a corresponding second code pattern according to a second table associating the second data pattern with the second code pattern; and selecting means (conversion pattern determining unit 53 in FIG. 3, for example) for selecting one of the first code pattern and the second code pattern on a basis of frequency of use of the second code pattern converted according to the second table.

An embodiment of the present invention is a modulating method or a program (for example a modulating method or a program performing the recording process of FIG. 4, for example) including: a first converting step (for example step S6 in FIG. 4 or step S79 in FIG. 6) of converting a part of input data which part matches a first data pattern into a corresponding first code pattern according to a first table associating the first data pattern with the first code pattern; a second converting step (for example step S5 in FIG. 4 or step S74 in FIG. 6) of converting a part of the input data which part matches a second data pattern into a corresponding second code pattern according to a second table associating the second data pattern with the second code pattern; and a selecting step (step S8 in FIG. 4, for example) of selecting one of the first code pattern and the second code pattern on a basis of frequency of use of the second code pattern converted according to the second table.

Preferred embodiments of the present invention will hereinafter be described. Hereinafter, a data string (data pattern) before conversion will be represented in parentheses as in (000011), and a channel bit string (code pattern) after conversion will be represented in quotation marks as in "000 100 100". In the present specification, a variable length code with a minimum run d=1, a maximum run k=7, and a conversion ratio (m:n)=(2:3) which code has a conversion table for performing perfect DSV control with efficient DSV control bits while limiting the number of successive occurrences of the minimum run and keeping the minimum run and the maximum run will be referred to as a 1,7PP code (PP: Parity-preserve Prohibit-repeated-minimum-transition-runlength).

The following Table 3 represents a modulation table according to an embodiment of the present invention.

TABLE 3

1,7PP-rmtr5_code. rev. 11 RLL(1, 7; 2, 3; 5)

| Data Pattern | Code Pattern |
|---|---|
| i = 1   11 | *0* |
|   10 | 001 |
|   01 | 010 |
| i = 2   0011 | 010 100 |
|   0010 | 010 000 |
|   0001 | 000 100 |
| i = 3   000011 | 000 100 100 |
|   000010 | 000 100 000 |
|   000001 | 010 100 100 |
|   000000 | 010 100 000 |
| i = 4   00001000 | 000 100 100 100 |
|   00000000 | 010 100 100 100 |
| i = 3   110111 | 001 000 000 (next 010) |
| i = 4   01110111 | (pre1) 010 000 000 101 (not 010) |
| i = 5   1001110111 | $0$ 010 000 000 101 (not 010) |
| If xx1 | then *0* = 000 |
|   xx0 | then *0* = 101 |
| If x10 or x01 | then $0$ = 000 |
|   x00 | then $0$ = 101 |

Sync & Termination

01 010 000 000 010 000 000 010 yyy yyy (30 cbits=SY_24 cbits+ID_6 cbits)

=0 not terminate case

=1 terminate case

| Termination Table | |
|---|---|
| 00 | 000 |
| 0000 | 010 100 |

When the conversion table of Table 3 is applied as it is to generate a codeword string, the codeword string has a minimum run d=1, a maximum run k=7, and an FS (frame sync) maximum run k=8, and successive occurrences of the minimum run are limited to five times.

Incidentally, the code pattern "001 000 000" (next 010) denotes that the conversion is performed when a code pattern following the code pattern "001 000 000" is "010". (pre1) in "(pre1) 010 000 000 101 (not 010)" denotes that the conversion is performed when an immediately preceding code is "1". (not 010) denotes that conversion is performed when an immediately succeeding code is not "010". The same is true for other conversion patterns.

As with the modulation table of Table 1 or Table 2, the modulation table of Table 3 includes conversion patterns composed of data patterns and code patterns. When a modulating device performs modulation according to the modulation table of Table 3, and a data string input to the modulating device matches a data pattern described in Table 3, the part of the data string which part matches the data pattern is converted into a corresponding code pattern (shown on a right side of Table 3), and the code pattern is then output as a codeword string.

The modulation table of Table 3 is a 1,7PP code, and has a basic composition similar to that of Table 2.

The modulation table of Table 3 is formed by a basic conversion table, a substitution conversion table, and a termination table.

The basic conversion table includes conversion patterns (basic patterns) without which conversion processing may not be carried out. The substitution conversion table includes conversion patterns (substitution patterns) without which conversion processing can be carried out but with which more effective conversion processing (limiting the maximum run and limiting successive occurrences of the minimum run) can be carried out. The termination table includes conversion patterns (terminating patterns) for terminating a code at an arbitrary position.

Specifically, in the modulation table shown in Table 3, a modulation table as the basic conversion table is a part formed by conversion patterns (basic patterns) including basic data patterns composed of data patterns (11) to (000000) and basic code patterns composed of code patterns "*0*" to "010 100 000" corresponding to the data patterns. A modulation table as the substitution conversion table is a part formed by conversion patterns (substitution patterns) including substitution data patterns composed of data patterns (00001000), (00000000), (110111), (01110111), and (1001110111) and substitution code patterns composed of code patterns "000 100 100 100", "010 100 100 100", "001 000 000 (next 010)", "(pre1) 010 000 000 101 (not 010)", and "$0$ 010 000 000 101 (not 010)" corresponding to the data patterns.

A part of the substitution conversion table which part includes the substitution data patterns composed of the data patterns (00001000) and (00000000) and the substitution code patterns composed of the code patterns "000 100 100 100" and "010 100 100 100" corresponding to the data patterns is a table of substitution patterns for limiting a maximum run. A part of the substitution conversion table which part includes the substitution data patterns composed of the data patterns (110111), (01110111), and (1001110111) and the substitution code patterns composed of the code patterns "001 000 000 (next 010)", "(pre1) 010 000 000 101 (not 010)", and "$0$ 010 000 000 101 (not 010)" corresponding to the data patterns is a table of substitution patterns for limiting successive occurrences of the minimum run.

The data patterns (11) to (00000000) and the code patterns "*0*" to "010 100 100 100" corresponding to the data patterns will hereinafter be described also as RLL conversion patterns.

On the other hand, the data patterns (110111), (01110111), and (1001110111) and the code patterns "001 000 000", "010 000 000 101", and "$0$ 010 000 000 101" (substitution patterns for limiting successive occurrences of the minimum run) corresponding to the data patterns will be described also as narrowly defined substitution patterns.

A modulation table as the termination table is a part formed by conversion patterns (termination patterns) including termination data patterns composed of data patterns (00) and (0000) and termination code patterns composed of code patterns "000" to "010 100" corresponding to the data patterns.

A modulation table describes correspondences between data patterns and code patterns. A part of Table 3 will hereinafter be also described as a modulation table or a conversion table as occasion demands.

Table 3 has a minimum run d=1, a maximum run k=7, and an indeterminate code (a code represented by a symbol *) as an element of a basic code. The indeterminate code is set to "0" or "1" so as to keep the minimum run d and the maximum run k regardless of an immediately preceding codeword and an immediately succeeding codeword. Specifically, in Table 3, when a two-piece data to be converted is (11), a code pattern "000" or "101" is selected depending on an immediately preceding codeword string (channel bit string), and the data pattern to be converted is converted to one of the code patterns "000" and "101". For example, when one channel bit of the immediately preceding codeword string is "1", the two-piece data (11) is converted to the codeword "000" to keep the minimum run d. When one channel bit of the immediately preceding codeword string is "0", the two-piece data (11) is converted to the codeword "101" to keep the maximum run k.

The conversion table of Table 3 has a variable length structure, and therefore the basic patterns include conversion patterns from i=1 to i=3.

In addition, the conversion table of Table 3 has a substitution pattern for limiting successive occurrences of the minimum run d at a constraint length i=3. When a data pattern is (110111), an immediately succeeding codeword is further referred to. When the succeeding codeword string matches a code pattern "010", the six-piece data is replaced with a code pattern "001 000 000". When the immediately succeeding codeword string does not match the code pattern "010", the six-piece data is converted into a codeword in divided units of two-piece data ((11), (01), and (11)). Thus, the six-piece data is converted into a codeword "*0* 010 *0*", that is, a codeword "*0* 010 101".

Further, the conversion table of Table 3 separately has a substitution pattern for limiting successive occurrences of the minimum run d at a constraint length i=5. When a data string is (1001110111), except for exceptional processing to be described later (processing when a succeeding code is "010"), the data string of 10 bits is replaced with a codeword "$0$ 010 000 000 101".

"$" is an indeterminate code for keeping the RLL rule and limiting successive occurrences of the minimum run to a predetermined number of times. Specifically, to keep the minimum run, when one channel bit of an immediately preceding codeword string is "1", the codeword "$0$" is converted to a codeword "000". To keep the maximum run, when one channel bit of the immediately preceding codeword string is "0", the codeword "$0$" is converted to a codeword "101". Further, to limit successive occurrences of the minimum run to a predetermined number of times, when three channel bits of the immediately preceding codeword string are "010", the codeword "$0$" is converted to a codeword "000".

Summarizing the above, when two channel bits of the immediately preceding codeword string are "10" or "01", the codeword "$0$" is converted to a codeword "000". Otherwise, that is, when the two channel bits of the immediately preceding codeword string are "00", the codeword "$0$" is converted to a codeword "101".

Incidentally, although there are four patterns for the two channel bits, the other pattern "11" does not satisfy the minimum run d=1, and is thus not used as a conversion pattern.

The exceptional processing is as follows. When a data string matches a data pattern (1001110111), an immediately succeeding codeword string is further referred to. When the succeeding codeword string is "010", en bloc replacement processing for conversion to the codeword "$0$ 010 000 000 101" as described above is not performed, and only the first two bits (10) is converted to a codeword "001". Thereafter, the data string is sectioned (divided) into (01) and (110111) and similarly converted sequentially.

The modulation table of Table 3 separately has a substitution pattern for limiting successive occurrences of the minimum run d at a constraint length i=4. When a data string to be converted is (01110111) in a codeword string after insertion of a synchronizing pattern, and an immediately preceding codeword is "1" and a succeeding codeword string is not "010", the eight-piece data is replaced with a codeword "010 000 000 101". When the immediately preceding codeword is "0" or the immediately succeeding codeword string is "010", the data string is sectioned (divided), and two-piece data (01) is converted to a codeword "010". Then, data (110111) is converted in a next conversion process.

Thus, successive occurrences of the minimum run in a codeword string resulting from the conversion of data are limited, and the minimum run is repeated five times at a maximum.

The conversion table of Table 3 has substitution patterns (maximum run guaranteeing patterns) for realizing the maximum run k=7 in conversion patterns with a constraint length i=4. Specifically, the data pattern (00001000) is converted to the code pattern "000 100 100 100", and the data pattern (00000000) is converted to the code pattern "010 100 100 100". Incidentally, also in this case, the minimum run d=1 is kept.

Further, in Table 3, when termination is effected at an arbitrary position of a data string to insert a synchronizing pattern, and when the data string has (00) or (0000) at a terminating position, a termination pattern is used. The inserted synchronizing pattern has a first codeword as a termination pattern use identifying bit. When a termination pattern is used, the first codeword of the immediately succeeding synchronizing pattern string is "1". When no termination pattern is used, the first codeword is "0". Incidentally, the synchronizing pattern in Table 3 has the above-mentioned termination pattern use identifying bit and a codeword with k=8 exceeding the maximum run k=7 (a pattern for identifying a synchronizing position) for detection of a synchronizing signal. The synchronizing pattern is further provided with six codewords as identifying bits for identifying the synchronizing pattern as one of a plurality of synchronizing patterns. The six codewords can be selected arbitrarily so as to keep the RLL rule.

Thus, as shown in Table 3, for example, the synchronizing pattern is formed by a total of 30 codewords (channel bits) with k=8 repeated twice.

The conversion patterns of Table 3 basically have a conversion rule such that a remainder when the number of "1"s in a data pattern is divided by two and a remainder when the number of "1"s in a corresponding code pattern is divided by two are both 1 or 0 and thus equal to each other (each of the patterns corresponding to each other has an odd number of "1"s or an even number of "1"s). For example, the data pattern (000001) of the conversion patterns corresponds to the code pattern "010 100 100". The number of "1"s in the data pattern is one, and the number of "1"s in the corresponding code pattern is three. A remainder when the number of "1"s in the data pattern is divided by two and a remainder when the number of "1"s in the corresponding code pattern is divided by two are both one (an odd number) and thus match each other. Similarly, the data pattern (000000) of the conversion patterns corresponds to the code pattern "010 100 000". The number of "1"s in the data pattern is zero, and the number of "1"s in the corresponding code pattern is two. A remainder when the number of "1"s in the data pattern is divided by two and a remainder when the number of "1"s in the corresponding code pattern is divided by two are both zero (an even number) and thus match each other. That is, these patterns are parity-preserved patterns in which parity is preserved.

When one DSV control bit is inserted as a redundant bit into a data string, and the DSV control bit is (1), the polarity "1" and "0" of a recording code string generated by converting the data string including the DSV control bit part to a channel bit string and subjecting the channel bit string to NRZI modulation is reversed. When the DSV control bit is (0), the polarity of a recording code string generated by converting the data string including the DSV control bit part to a channel bit string and subjecting the channel bit string to NRZI modulation is not reversed. Hence, because the polarity of the recording code string after the data string is subjected to data conversion and then the result is subjected to NRZI modulation can be changed by the one bit inserted as a redundant bit into the data string, DSV control can be performed in the data string. That is, Table 3 has a rule (basic rule) that enables the DSV of code to be controlled by a data string.

When a substitution pattern for limiting successive occurrences of the minimum run d at a constraint length i=4 in Table 3 is converted, the eight-bit data pattern (01110111) is replaced with a 12-channel-bit code pattern "010 000 000 101". These patterns are parity preservation violating patterns in which a remainder when the number of "1"s in the data pattern is divided by two and a remainder when the number of "1"s in the code pattern is divided by two do not match each other as 1 or 0. Hence, this modulation table has, in a part thereof, a rule (specific rule) that does not enable the DSV of code to be controlled by a data string.

Accordingly, Table 3 limits a position at which the substitution pattern for limiting successive occurrences of the minimum run d at the constraint length i=4 which pattern does not enable DSV control appears to a position immediately succeeding a synchronizing pattern. Because a synchronizing pattern is 30 codewords and the parity preservation violating pattern "010 000 000 101" is 12 channel bits, a total number of channel bits is 42. With a conversion ratio (m/n), the 42 channel bits are converted to 28 data bits (42×(conversion ratio)=42×2/3=28). Accordingly, one DSV control bit is inserted into a data string at intervals of more than 28-piece data (a DSV section is more than 28 bits). Thereby effects of the parity preservation violating pattern can be avoided. Thus, in Table 3, 28-piece data+1 DSV control bit is a minimum value that eliminates the effects of the parity preservation violating pattern. When the DSV section is an interval more than the minimum value (for example 45+1 DSV), DSV control can be performed normally.

The present embodiment provides a modulating device with consideration given to reproduction compatibility. Suppose that a table having reproduction compatibility is the modulation table of Table 2, and that a new table improved in performance is the modulation table of Table 3. As is clear from a comparison of Table 2 and Table 3, a difference between Table 2 and Table 3, that is, a part added in Table 3 is as follows.

TABLE 4

| Data Pattern | Code Pattern |
| --- | --- |
| i = 4  01110111 | (pre1) 010 000 000 101 (not 010) |
| i = 5  1001110111 | $0$ 010 000 000 101 (not 010) |

Accordingly, since conversion processing in Table 4 is substitution processing, control is performed individually to determine whether to perform this substitution processing or not, whereby consideration can be given so as to enable even a codeword string resulting from Table 3 to be demodulated by a demodulating device (decoder) based on the existing 1,7PP code (Table 2).

An embodiment of a modulating device according to the present invention will next be described with reference to the drawings. In this embodiment, a data string is converted to variable length code (d, k; m, n; r)=(1, 7; 2, 3; 5) according to Table 3.

Figure 1:
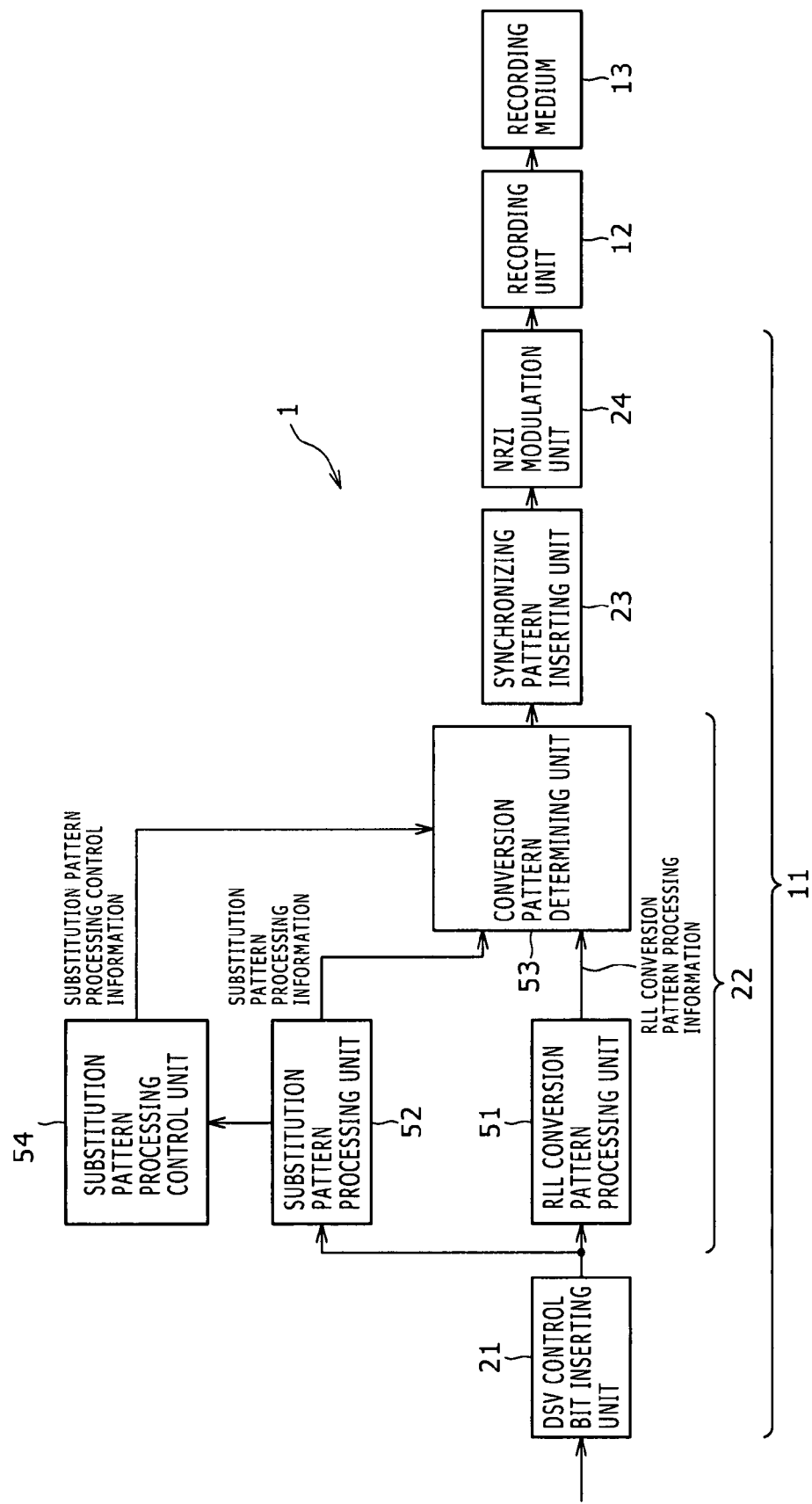
FIG. 1 is a block diagram showing a configuration of a modulating device according to an embodiment of the present invention.

FIG. 1 shows a fundamental configuration of the embodiment of the modulating device according to the present invention. The modulating device 1 includes a coding device 11 and a recording unit 12 for recording a code string onto a recording medium 13. The coding device 11 includes a DSV control bit inserting unit 21, a modulating unit 22, a synchronizing pattern inserting unit 23, and an NRZI modulation unit 24. The modulating unit 22 includes an RLL conversion pattern processing unit 51, a substitution pattern processing unit 52, a conversion pattern determining unit 53, and a substitution pattern processing control unit 54.

The RLL conversion pattern processing unit 51 has a table (first table) of RLL conversion patterns. The substitution pattern processing unit 52 has a table (second table) of substitution patterns. The RLL conversion pattern processing unit 51 generates a code string (RLL conversion pattern processing information) keeping the RLL rule from input data from the DSV control bit inserting unit 21. The substitution pattern processing unit 52 generates, from the input data, a codeword string (substitution pattern processing information) according to patterns for limiting successive occurrences of the minimum run. Incidentally, not only the parity-preserved patterns but also the parity preservation violating patterns as the conversion patterns in Table 3 can be used in both of a DSV section in which a synchronizing pattern is inserted and a DSV section in which no synchronizing pattern is inserted. That is, positions in which the conversion patterns are used are not limited. The substitution pattern processing control unit 54 generates substitution pattern processing control information using information on predetermined substitution patterns output by the substitution pattern processing unit 52. The conversion pattern determining unit 53 determines a conversion pattern using the RLL conversion pattern processing information, the substitution pattern processing information, and the substitution pattern processing control information. The conversion pattern determining unit 53 then outputs the codeword string.

The RLL conversion pattern processing unit 51 performs the following conversions. That is, the RLL conversion pattern processing unit 51 has the following table of Table 5 as a part of Table 3 as a table corresponding to the other table (Table 2) having reproduction compatibility.

TABLE 5

| Data Pattern | Code Pattern |
| --- | --- |
| i = 1  11 | *0* |
| 10 | 001 |
| 01 | 010 |
| i = 2  0011 | 010 100 |
| 0010 | 010 000 |
| 0001 | 000 100 |
| i = 3  000011 | 000 100 100 |
| 000010 | 000 100 000 |
| 000001 | 010 100 100 |
| 000000 | 010 100 000 |
| i = 4  00001000 | 000 100 100 100 |
| 00000000 | 010 100 100 100 |

The substitution pattern processing unit 52 performs the following conversions in Table 6.

TABLE 6

| | |
| --- | --- |
| i = 3  110111 | 001 000 000 (next 010) |
| i = 4  01110111 | (pre1) 010 000 000 101 (not 010) |
| i = 5  1001110111 | $0$ 010 000 000 101 (not 010) |

The substitution pattern processing unit 52 transmits information to the substitution pattern processing control unit 54 when converting the conversion control object patterns in Table 4.

The conversion pattern determining unit 53 determines a conversion pattern using the RLL conversion pattern processing information, the substitution pattern processing information, and the substitution pattern processing control information. The conversion pattern determining unit 53 then outputs the conversion pattern to the synchronizing pattern inserting unit 23. The substitution pattern processing control information is a substitution permitting flag for the two kinds of substitution patterns described above. When the substitution permitting flag is on, and there is a predetermined substitution pattern, the conversion pattern determining unit 53 selects processing based on the substitution pattern. On the other hand, in a case where the substitution permitting flag is off, even when there is a predetermined substitution pattern, the conversion pattern determining unit 53 does not select the processing based on the substitution pattern.

The synchronizing pattern inserting unit 23 inserts a synchronizing pattern into the code string input to the synchronizing pattern inserting unit 23, and then outputs the code string having the synchronizing pattern inserted therein to the NRZI modulation unit 24. The NRZI modulation unit 24 subjects the code string having the synchronizing pattern inserted therein to NRZI modulation. The recording unit 12 records the NRZI-modulated code string onto the recording medium 13 formed by an optical disk, a magneto-optical disk or the like.

Figure 2:
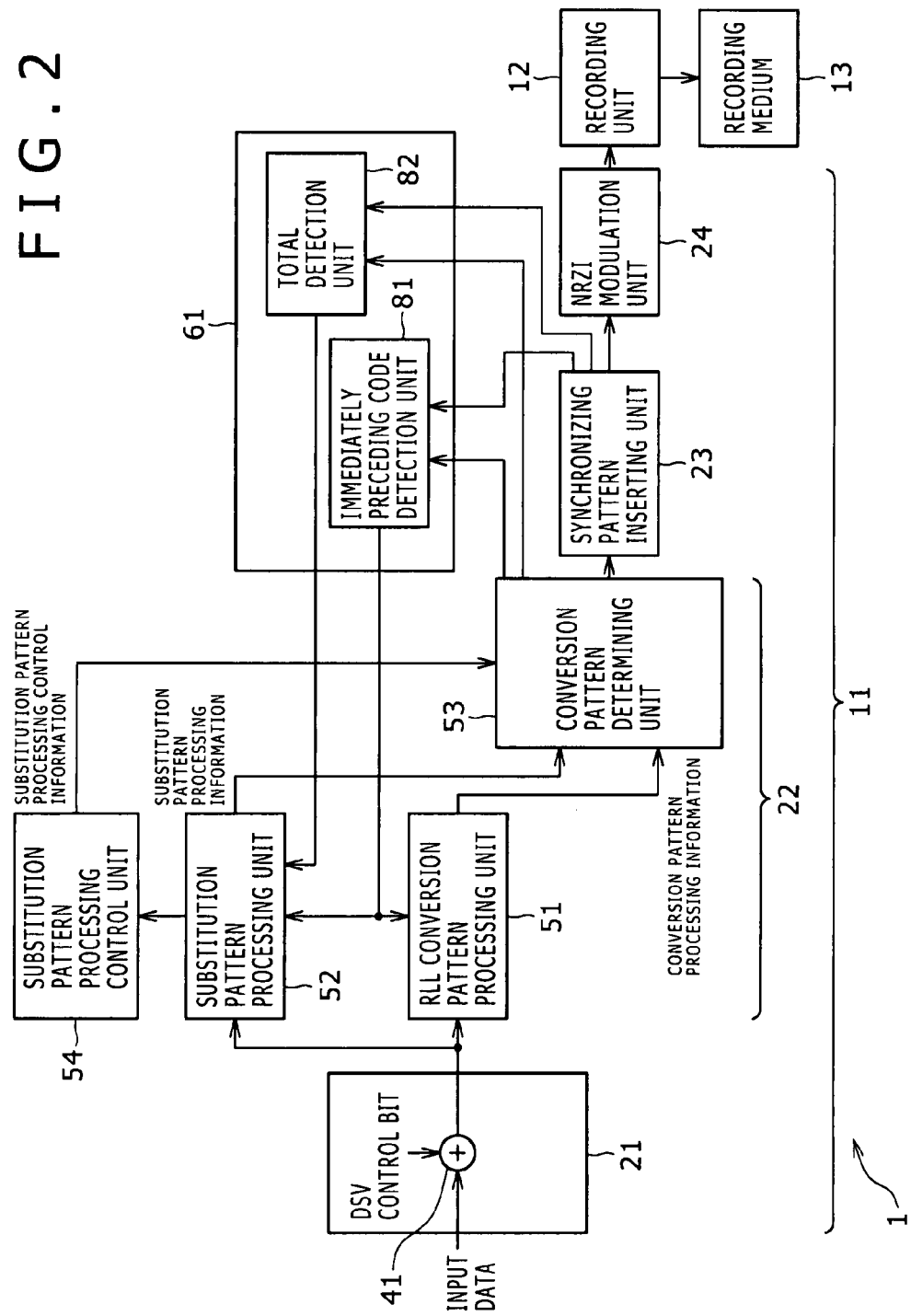
FIG. 2 is a block diagram showing a detailed configuration of a coding device in FIG. 1.

FIG. 2 is a block diagram showing a configuration of an embodiment of the modulating device 1. In addition to the configuration shown in FIG. 1, the modulating device 1 has a detection unit 61 including an immediately preceding code detection unit 81 and a total detection unit 82. Further, the DSV control bit inserting unit 21 has an adder 41 for adding a DSV control bit to the input data.

The adder 41 inserts a DSV control bit into the input data string at predetermined intervals. The input data string having DSV control bits inserted therein is sent to the RLL conversion pattern processing unit 51 and the substitution pattern processing unit 52. The RLL conversion pattern processing unit 51 has the part of basic patterns in Table 3 and the substitution patterns for realizing the maximum run k=7 (the RLL conversion pattern processing unit 51 has the RLL conversion patterns). The RLL conversion pattern processing unit 51 performs conversion pattern processing in such a manner as to keep the RLL rule, and then supplies resulting processing information to the conversion pattern determining unit 53. Information from the immediately preceding code detection unit 81 is used for this conversion pattern processing. The RLL conversion pattern processing unit 51 also has a termination table for inserting a synchronizing pattern. The RLL conversion pattern processing unit 51 uses the termination table as occasion demands to effect termination at a predetermined position. When the termination table is used, information indicating that the termination table is used is given within the synchronizing pattern.

The substitution pattern processing unit 52 has substitution patterns for limiting successive occurrences of the minimum run d in Table 3. The substitution pattern processing unit 52 performs processing so as to limit successive occurrences of the minimum run d to a desired number of successive occurrences of the minimum run, and then supplies resulting processing information to the conversion pattern determining unit 53. For this processing, information from the immediately preceding code detection unit 81 and information from the total detection unit 82 are used. The substitution pattern processing control unit 54 performs control processing relating to the conversion control object patterns of Table 4. The substitution pattern processing control unit 54 performs control so as to determine whether or not to perform conversion processing based on a conversion control object pattern. For example, under a predetermined condition, conversion processing based on a conversion control object pattern is prohibited. The substitution pattern processing information is output for each of the two conversion control object patterns.

The conversion pattern determining unit 53 selects a finally determined conversion pattern on the basis of the information from the RLL conversion pattern processing unit 51, the information from the substitution pattern processing unit 52, and the information from the substitution pattern processing control unit 54, and then outputs the codeword string. For example, a substitution pattern the conversion of which is prohibited by the substitution pattern processing control information is not selected as a conversion pattern. The synchronizing pattern inserting unit 23 inserts a synchronizing pattern into the codeword string at a predetermined position at a predetermined interval. Termination table processing information output from the RLL conversion pattern processing unit 51 is used as occasion demands to determine the synchronizing pattern. The output of the synchronizing pattern inserting unit 23 is subjected to NRZI modulation in the NRZI modulation unit 24, and then output as a recording code string (or output as a transmission code string to a transmission line). This output is recorded onto the recording medium 13 by the recording unit 12, or transmitted to a predetermined transmission line.

The immediately preceding code detection unit 81 in FIG. 2 generates information necessary to guarantee RLL from the conversion pattern finally determined and output by the conversion pattern determining unit 53 and the output of the synchronizing pattern inserting unit 23. The immediately preceding code detection unit 81 supplies the information to the RLL conversion pattern processing unit 51 and the substitution pattern processing unit 52.

The total detection unit 82 generates information necessary to guarantee the limited number of successive occurrences of the minimum run from the conversion pattern finally determined and output by the conversion pattern determining unit 53 and the synchronizing pattern output by the synchronizing pattern inserting unit 23. The total detection unit 82 supplies the information to the substitution pattern processing unit 52.

In addition, though not shown, a clearing signal is input to the substitution pattern processing control unit 54, so that, for example, internal information and output can be cleared by the clearing signal at predetermined intervals as occasion demands. Further, a control signal is input, so that, for example, processing control can be changed by the control signal as occasion demands.

Timing of operation of each part is managed in synchronism with a timing signal supplied from a timing managing unit not shown in the figure.

FIG. 3 is a block diagram showing a more detailed configuration of the coding device 11. The DSV control bit inserting unit 21 has a shift register 42 in addition to the adder 41. The RLL conversion pattern processing unit 51 includes a conversion pattern detecting unit 121, a conversion table 122 (122A to 122D), a selector 123, and an indeterminate bit determining unit 124. The substitution pattern processing unit 52 includes a minimum run successive occurrence limiting pattern detection predicting unit 111, a minimum run successive occurrence limiting pattern detecting unit 112, a minimum run successive occurrence limiting table 113 (113A and 113B), an indeterminate bit determining unit 114, a specific rule conversion pattern detecting unit 115, and a specific rule conversion table 116.

The adder 41 inserts a DSV control bit into an input data string at predetermined intervals. The shift register 42 sequentially shifts the input data string having DSV control bits inserted therein by one-piece data, whereas processing is performed in units of two-piece data. Each of the conversion pattern detecting unit 121, the minimum run successive occurrence limiting pattern detecting unit 112, the minimum run successive occurrence limiting pattern detection predicting unit 111, and the specific rule conversion pattern detecting unit 115 is supplied with the data string in units of two-piece data necessary for each unit to perform the processing thereof.

When Table 3 is applied, a maximum number of bits of reference data necessary for each unit to perform the processing thereof is 15.

The conversion pattern detecting unit 121 detects a conversion pattern keeping the RLL rule from the data string. The conversion pattern detecting unit 121 outputs information on a result of the detection to the conversion pattern determining unit 53 and conversion tables 122A to 122D. Indeterminate bits within the conversion table 122A are determined and output by the selector 123 and the indeterminate bit determining unit 124. Each of the conversion tables 122A to 122D supplies a detected conversion pattern (converted channel bit string) to the conversion pattern determining unit 53. In addition, the conversion pattern detecting unit 121 outputs indeterminate pattern identifying information as occasion demands.

When the minimum run successive occurrence limiting pattern detecting unit 112 detects a conversion pattern for limiting the number of successive occurrences of the minimum run in the data string, the minimum run successive occurrence limiting pattern detecting unit 112 outputs information indicating that the conversion pattern is detected as minimum run successive occurrence limiting pattern detection information to the conversion pattern determining unit 53, and also outputs the information as minimum run successive occurrence limiting pattern detection information to each of minimum run successive occurrence limiting tables 113A and 113B. Indeterminate bits within the minimum run successive occurrence limiting table 113B are determined and output by the indeterminate bit determining unit 114. Each of the minimum run successive occurrence limiting tables 113A and 113B supplies a detected conversion pattern (converted channel bit string) to the conversion pattern determining unit 53. The minimum run successive occurrence limiting pattern detection information is also output to the substitution pattern processing control unit 54.

When the minimum run successive occurrence limiting pattern detection predicting unit 111 detects a predetermined conversion pattern of the conversion patterns for limiting the number of successive occurrences of the minimum run at a predetermined position of the data string which position is not a start of the data string, the minimum run successive occurrence limiting pattern detection predicting unit 111 outputs information indicating that the predetermined conversion pattern is detected to the conversion pattern determining unit 53, and also outputs the information to the substitution pattern processing control unit 54.

The specific rule conversion pattern detecting unit 115 has the substitution pattern having the specific rule that does not enable the DSV control to be performed within the data string, among the substitution patterns for limiting successive occurrences of the minimum run d in Table 3. When detecting the conversion pattern, the specific rule conversion pattern detecting unit 115 outputs information indicating that the conversion pattern is detected as specific rule conversion pattern detection information to the conversion pattern determining unit 53, and also outputs the information to the specific rule conversion table 116. The specific rule conversion table 116 supplies a detected conversion pattern (converted channel bit string) to the conversion pattern determining unit 53. The specific rule conversion pattern detection information is also output to the substitution pattern processing control unit 54. The information of a synchronizing pattern inserted in an immediately preceding position is used as occasion demands to detect the specific rule conversion pattern.

The substitution pattern processing control unit 54 performs control processing relating to the conversion patterns in Table 4. The substitution pattern processing control unit 54 performs control so as to determine whether or not to perform conversion processing on the conversion patterns in Table 4 on the basis of the information from the minimum run successive occurrence limiting pattern detecting unit 112, the minimum run successive occurrence limiting pattern detection predicting unit 111, and the specific rule conversion pattern detecting unit 115. Under a predetermined condition, conversion processing on a conversion pattern in Table 4 is prohibited. Substitution pattern processing control information is output for each of the conversion patterns in Table 4.

The conversion pattern determining unit 53 determines a conversion pattern from the outputs of the channel bit strings from the conversion tables 122A to 122D, the minimum run successive occurrence limiting tables 113A and 113B, and the specific rule conversion table 116 on the basis of the information from the conversion pattern detecting unit 121, the minimum run successive occurrence limiting pattern detecting unit 112, the minimum run successive occurrence limiting pattern detection predicting unit 111, the specific rule conversion pattern detecting unit 115, and the substitution pattern processing control unit 54. The conversion pattern determining unit 53 then outputs the conversion pattern. A substitution pattern the conversion of which is prohibited by the substitution pattern processing control information is not selected.

The synchronizing pattern inserting unit 23 inserts a synchronizing pattern into the determined converted pattern string at a predetermined position at a predetermined interval, and then outputs the pattern string having the synchronizing pattern inserted therein. In determining the synchronizing pattern, information on termination table processing is used as occasion demands which information is generated in the conversion pattern detecting unit 121 and obtained via the conversion pattern determining unit 53.

The NRZI modulation unit 24 subjects the channel bit string after the insertion of the synchronizing pattern to NRZI modulation, and then outputs the result as a recording code string (or as a transmission code string to a transmission line). This recording code string is recorded on the recording medium 13. Alternatively, this transmission code string is transmitted to a predetermined transmission line.

The immediately preceding code detection unit 81 in FIG. 3 generates information necessary to guarantee RLL on the basis of the outputs of the conversion pattern determining unit 53 and the synchronizing pattern inserting unit 23. The immediately preceding code detection unit 81 then outputs the information to the indeterminate bit determining unit 114 and the indeterminate bit determining unit 124.

The total detection unit 82 generates information necessary to guarantee the limited number of successive occurrences of the minimum run on the basis of the outputs of the conversion pattern determining unit 53 and the synchronizing pattern inserting unit 23. The total detection unit 82 supplies the information to the indeterminate bit determining unit 114, and separately supplies the information to the specific rule conversion pattern detecting unit 115.

Timing of operation of each part is managed in synchronism with a timing signal supplied from a timing managing unit not shown in the figure.

A recording method (modulating method) of the modulating device 1 in FIGS. 1 to 3 will next be described with reference to a flowchart of FIG. 4. In step S1, the adder 41 of the DSV control bit inserting unit 21 adds DSV control bits to an input data string.

In step S2, the shift register 42 retains the data string having the DSV control bits added thereto, which data string is supplied from the adder 41, in units of two bits. In step S3, the minimum run successive occurrence limiting pattern detection predicting unit 111 performs a prediction process. In step S4, the minimum run successive occurrence limiting pattern detecting unit 112 and the minimum run successive occurrence limiting table 113 perform a minimum run successive occurrence limiting pattern detecting process. In step S5, the specific rule conversion pattern detecting unit 115 and the specific rule conversion table 116 perform a specific rule conversion pattern detecting process. In step S6, the RLL conversion pattern processing unit 51 (the conversion pattern detecting unit 121 and the conversion table 122) performs a conversion pattern detecting process.

Incidentally, in practice, these processes of steps S3 to S6 are performed in parallel with each other.

Figure 5:
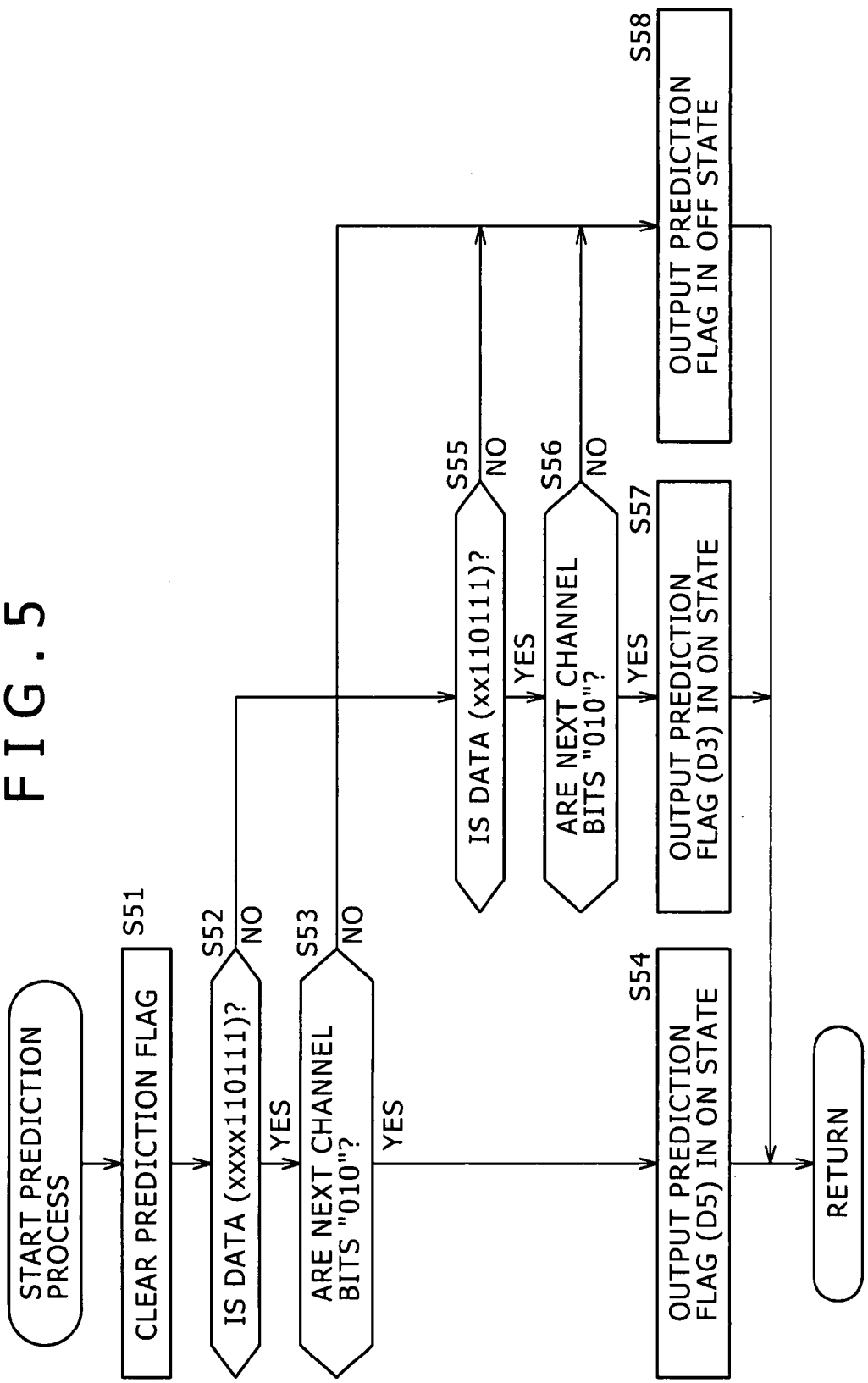
FIG. 5 is a flowchart of assistance in explaining a prediction process in step S3 in FIG. 4.

Though details of the prediction process in step S3 will be described later with reference to a flowchart of FIG. 5, this process turns on a prediction flag (D5) when data includes a conversion pattern (110111) from a midpoint (fifth bit) of the data and when next channel bits are "010", and turns on a prediction flag (D3) when the data includes the conversion pattern (110111) from a midpoint (third bit) of the data and when the next channel bits are "010". Otherwise, the prediction flag is turned off.

On the other hand, though details of the minimum run successive occurrence limiting pattern detecting process in step S4 will be described later with reference to a flowchart of FIG. 6, this process turns on a minimum run successive occurrence limiting pattern detection flag (10-piece data) when the data is a conversion pattern (1001110111), and a process of converting the 10-piece data to 15 channel bits is performed. When the data is a conversion pattern (110111) and next channel bits are "010", a minimum run successive occurrence limiting pattern detection flag (six-piece data) is turned on. Otherwise, the minimum run successive occurrence limiting data detection flag is turned off.

Though details of the specific rule conversion pattern detecting process in step S5 will be described later with reference to a flowchart of FIG. 8, this process turns on a specific rule conversion pattern detection flag when the data matches a data pattern (01110111) and when a minimum run successive occurrence limiting total flag (2) is on, and converts the eight-piece data to 12 channel bits. Otherwise, the specific rule conversion pattern detection flag is turned off.

Figure 9:
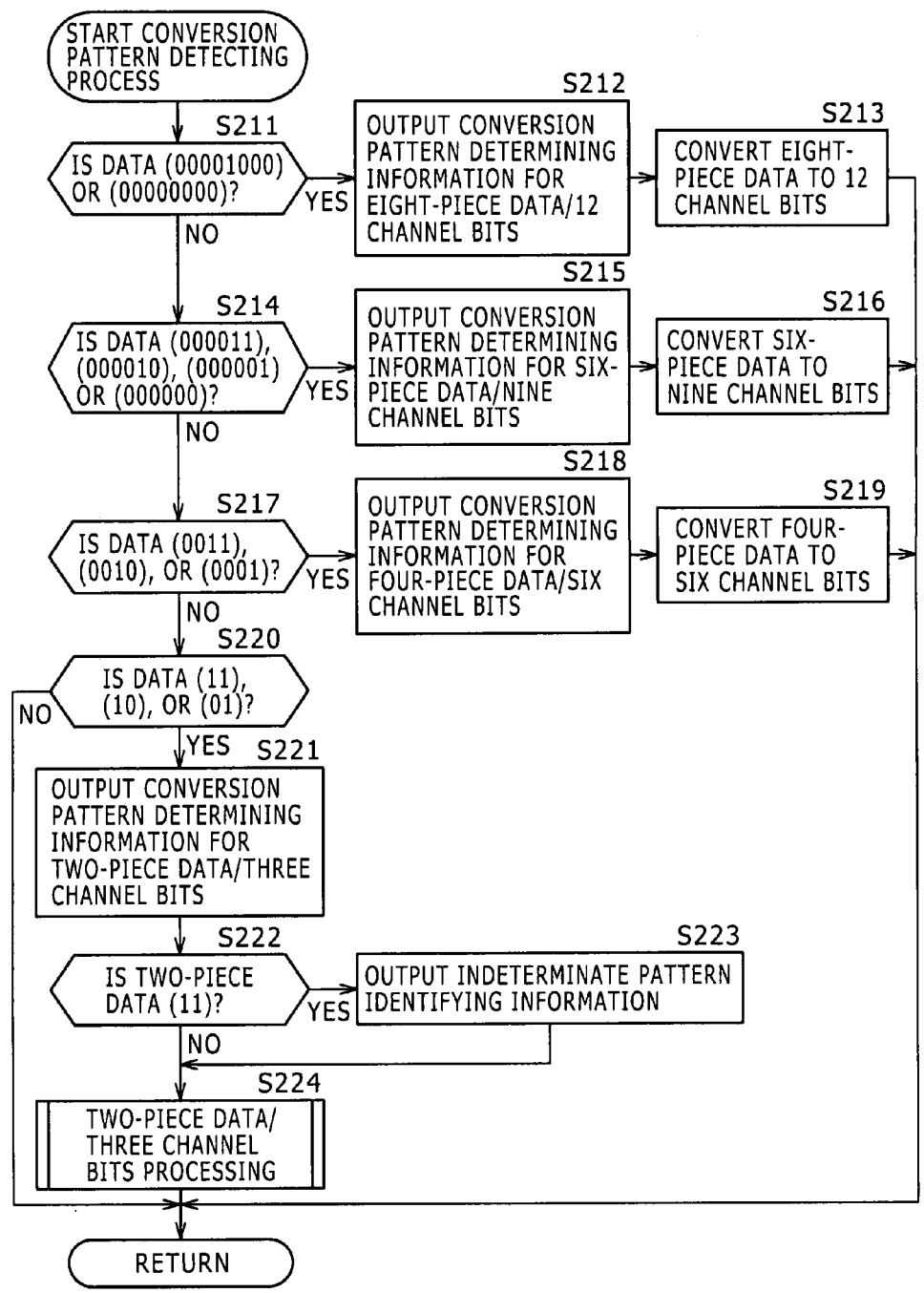
FIG. 9 is a flowchart of assistance in explaining a conversion pattern detecting process in step S6 in FIG. 4.

Though details of the conversion pattern detecting process in step S6 will be described later with reference to a flowchart of FIG. 9, this process converts eight-piece data to 12 channel bits, converts six-piece data to nine channel bits, converts four-piece data to six channel bits, or converts two-piece data to three channel bits.

Returning to FIG. 4, in next step S7, the substitution pattern processing control unit 54 performs substitution pattern processing control. Though details of this process will be described later with reference to a flowchart of FIG. 13, this process turns off a substitution pattern control flag (1) when the number of times that a minimum run successive occurrence limiting pattern detection flag (10-piece data) is on and the prediction flag (D5) is off becomes equal to or larger than a predetermined reference value set in advance. When the substitution pattern control flag (1) is turned off, the conversion of the minimum run successive occurrence limiting pattern of 10-piece data (the data pattern (1001110111) in Table 4) is prohibited. In addition, a substitution pattern control flag (2) is turned off when the number of times that the specific rule conversion pattern detection flag is on and the prediction flag (D3) is off becomes equal to or larger than a predetermined reference value set in advance. When the substitution pattern control flag (2) is turned off, the conversion of the minimum run successive occurrence limiting pattern of eight-piece data (the parity preservation violating data pattern (01110111) in Table 4) is prohibited.

In step S8, the conversion pattern determining unit 53 performs a conversion pattern determining process. Though details of the conversion pattern determining process will be described later with reference to a flowchart of FIG. 14, this process selects and outputs one of the code patterns converted by the conversion table 122 in the RLL conversion pattern processing unit 51, the code patterns converted by the minimum run successive occurrence limiting table 113, and the code pattern converted by the specific rule conversion table 116.

In step S9, the synchronizing pattern inserting unit 23 inserts a synchronizing pattern into a code string including the finally determined conversion pattern input from the conversion pattern determining unit 53. In step S10, the NRZI modulation unit 24 subjects the code string having the synchronizing pattern inserted therein, the code string being supplied from the synchronizing pattern inserting unit 23, to NRZI modulation. In step S11, the recording unit 12 records a recording code string NRZI-modulated by the NRZI modulation unit 24 onto the recording medium 13.

Details of the prediction process in step S3 in FIG. 4 will next be described with reference to the flowchart of FIG. 5.

In step S51, the minimum run successive occurrence limiting pattern detection predicting unit 111 clears the prediction flag. That is, the prediction flag (D5) and the prediction flag (D3) output in steps S54 and S57 to be described later are cleared. In step S52, the minimum run successive occurrence limiting pattern detection predicting unit 111 determines whether the data supplied from the shift register 42 matches a data pattern (xxxx110111). When the input data matches the data pattern (xxxx110111) (the data matches the data pattern (110111) from a fifth bit of the data), the minimum run successive occurrence limiting pattern detection predicting unit 111 determines in step S53 whether next channel bits are "010". When the next channel bits are "010", the minimum run successive occurrence limiting pattern detection predicting unit 111 in step S54 outputs the prediction flag (D5) in an on state as minimum run successive occurrence limiting pattern detection predicting information to the conversion pattern determining unit 53 and the substitution pattern processing control unit 54. This flag is used in step S333 in FIG. 13 and step S362 in FIG. 14 to be described later.

When the minimum run successive occurrence limiting pattern detection predicting unit 111 determines in step S52 that the data does not match the data pattern (xxxx110111), the minimum run successive occurrence limiting pattern detection predicting unit 111 in step S55 determines whether the data matches a data pattern (xx110111). When the input data matches the data pattern (xx110111) (the data matches the data pattern (110111) from a third bit of the data), the minimum run successive occurrence limiting pattern detection predicting unit 111 determines in step S56 whether the next channel bits are "010". When the next channel bits are "010", the minimum run successive occurrence limiting pattern detection predicting unit 111 in step S57 outputs the prediction flag (D3) in an on state as minimum run successive occurrence limiting pattern detection predicting information to the conversion pattern determining unit 53 and the substitution pattern processing control unit 54. This flag is used in step S339 in FIG. 13 and step S368 in FIG. 14 to be described later.

When it is determined in step S53 that the next channel bits are not "010" (when the next channel bits are "000", "101", or "001"), when it is determined in step S55 that the data does not match the data pattern (xx110111), or when it is determined in step S56 that the next channel bits are not "010" (when the next channel bits are "000", "101", or "001"), the minimum run successive occurrence limiting pattern detection predicting unit 111 in step S58 outputs the prediction flag in an off state. This prediction flag being off means that the prediction flag (D5) generated in step S54 is off and that the prediction flag (D3) generated in step S57 is off.

The minimum run successive occurrence limiting pattern detecting process in step S4 in FIG. 4 will next be described with reference to the flowchart of FIG. 6.

In step S71, the minimum run successive occurrence limiting pattern detecting unit 112 clears a detection flag. That is, the minimum run successive occurrence limiting pattern detection flags (10-piece data) and (six-piece data) output in steps S73 and S78 to be described later are cleared. In step S72, the minimum run successive occurrence limiting pattern detecting unit 112 determines whether the data supplied from the shift register 42 matches a data pattern (1001110111). When the input data matches the data pattern (1001110111), the minimum run successive occurrence limiting pattern detecting unit 112 in step S73 outputs the minimum run successive occurrence limiting pattern detection flag (10-piece data) in an on state as minimum run successive occurrence limiting pattern detection information to the conversion pattern determining unit 53 and the minimum run successive occurrence limiting tables 113A and 113B as well as the substitution pattern processing control unit 54. This flag is used in step S332 in FIG. 13 and step S361 in FIG. 14 to be described later.

In step S74, the minimum run successive occurrence limiting table 113B performs 10-piece data/15 channel bits processing. Details of this processing are shown in FIG. 7.

Figure 7:
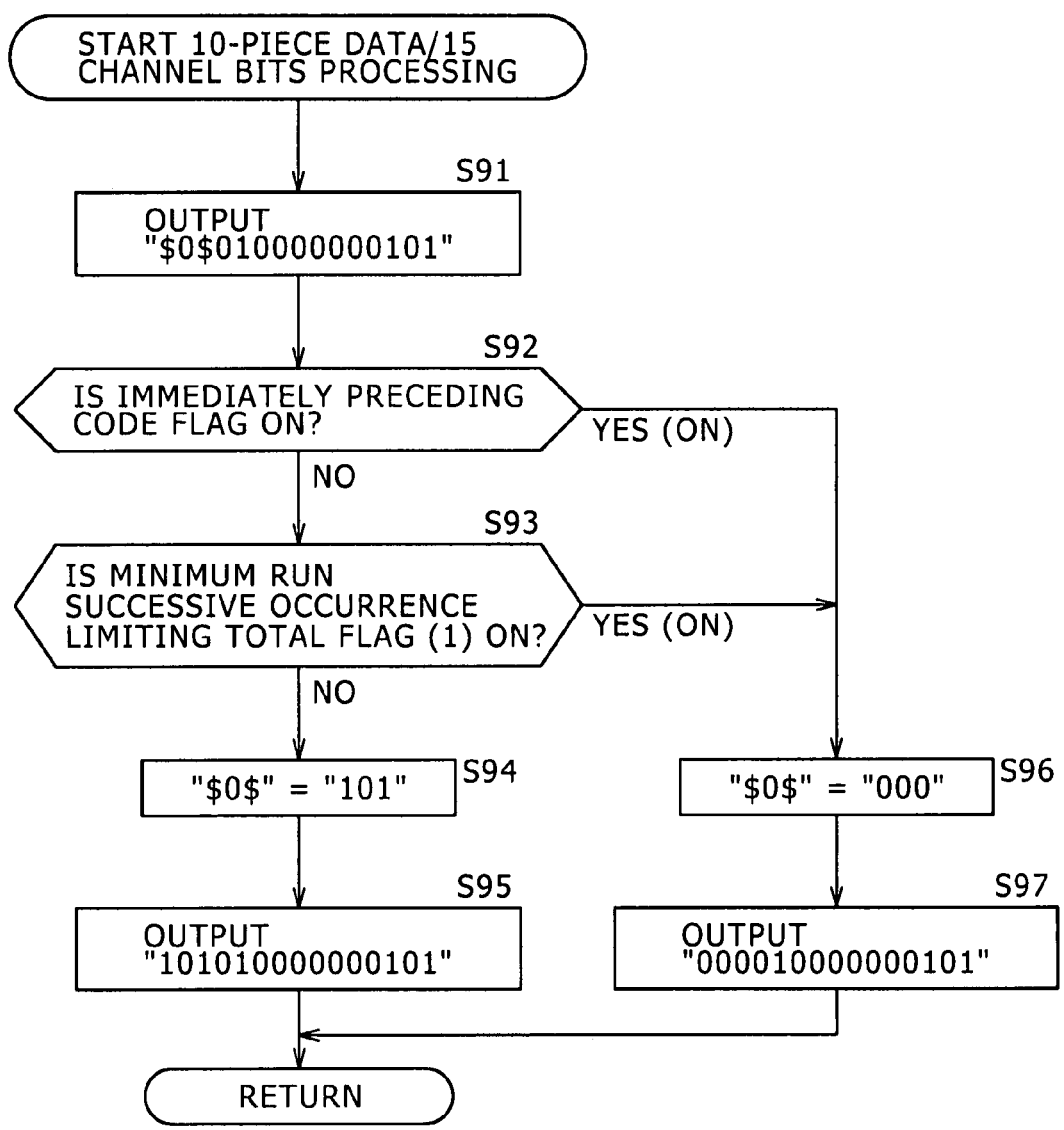
FIG. 7 is a flowchart of assistance in explaining 10-piece data/15 channel bits processing in step S74 in FIG. 6.

In step S91 in FIG. 7, the minimum run successive occurrence limiting table 113B outputs a code pattern "$0$ 010 000 000 101" to the indeterminate bit determining unit 114. In step S92, the indeterminate bit determining unit 114 determines whether an immediately preceding code flag is on. The immediately preceding code flag is output by the immediately preceding code detection unit 81, and is on when one channel bit of an immediately preceding codeword string is "1" (details of the immediately preceding code flag will be described later with reference to FIG. 11).

When it is determined in step S92 that the immediately preceding code flag is on (when the immediately preceding code is "1"), the indeterminate bit determining unit 114 in step S96 sets the codeword "$0$" including an indeterminate code which codeword is output in step S91 to "000". The indeterminate bit determining unit 114 in step S97 outputs "000 010 000 000 101".

When it is determined in step S92 that the immediately preceding code flag is not on (the immediately preceding code flag is off) (when the immediately preceding code is "0"), the indeterminate bit determining unit 114 in step S93 determines whether a minimum run successive occurrence limiting total flag (1) is on. The minimum run successive occurrence limiting total flag (1) is output by the total detection unit 82, and is on when three channel bits of the immediately preceding codeword string is "010" (details of the minimum run successive occurrence limiting total flag (1) will be described later with reference to FIG. 12).

When it is determined in step S93 that the minimum run successive occurrence limiting total flag (1) is on (when the immediately preceding codes are "010"), the indeterminate bit determining unit 114 in step S96 sets "$0$" to "000" as in the case where the immediately preceding code flag is on. The indeterminate bit determining unit 114 in step S97 outputs the channel bit string "000 010 000 000 101". This substitution pattern (channel bit string) is selected and output in step S364 in FIG. 14.

When it is determined in step S93 that the minimum run successive occurrence limiting total flag (1) is not on (the minimum run successive occurrence limiting total flag (1) is off) (when the immediately preceding codes are not "010"), the indeterminate bit determining unit 114 in step S94 sets the codeword "$0$" to "101". The indeterminate bit determining unit 114 in step S95 outputs a channel bit string "101 010 000 000 101". This substitution pattern (channel bit string) is selected and output in step S364 in FIG. 14.

Returning to FIG. 6, when it is determined in step S72 that the data does not match the data pattern (1001110111), the minimum run successive occurrence limiting pattern detecting unit 112 in step S75 determines whether the data matches a data pattern (110111). When the data matches the data pattern (110111), the minimum run successive occurrence limiting pattern detecting unit 112 in step S76 determines whether next three channel bits are "010". When the next three channel bits are "010", the minimum run successive occurrence limiting pattern detecting unit 112 in step S78 outputs the minimum run successive occurrence limiting pattern detection flag (six-piece data) in an on state. This flag is used in step S365 in FIG. 14. In step S79, the minimum run successive occurrence limiting table 113A outputs a substitution pattern "001 000 000" to the conversion pattern determining unit 53. This substitution pattern (channel bit string) is selected and output in step S366 in FIG. 14.

When it is determined in step S75 that the input data does not match the data pattern (110111), and when it is determined in step S76 that the next three channel bits are not "010", the minimum run successive occurrence limiting pattern detecting unit 112 in step S77 outputs the minimum run successive occurrence limiting pattern detection flag in an off state to the conversion pattern determining unit 53. The minimum run successive occurrence limiting pattern detection flag being in the off state means that the minimum run successive occurrence limiting pattern detection flag (10-piece data) is off, and that the minimum run successive occurrence limiting pattern detection flag (six-piece data) is off.

The specific rule conversion pattern detecting process in step S5 in FIG. 4 will next be described with reference to a flowchart of FIG. 8.

In step S151, the specific rule conversion pattern detecting unit 115 determines whether the data matches a data pattern (01110111). When the data matches the data pattern (01110111), the specific rule conversion pattern detecting unit 115 in step S152 determines whether the minimum run successive occurrence limiting total flag (2) is on. When the minimum run successive occurrence limiting total flag (2) is on (when one channel bit of an immediately preceding codeword string is "1", as will be described later with reference to FIG. 12), the specific rule conversion pattern detecting unit 115 in step S153 outputs the specific rule conversion pattern detection flag in an on state. This flag is used in step S338 in FIG. 13 and step S367 in FIG. 14. In step S154, the specific rule conversion table 116 converts the eight-piece data into 12 channel bits. Specifically, the data pattern (01110111) is converted en bloc into a code pattern "010 000 000 101". This channel bit string is selected and output in step S370 in FIG. 14.

When it is determined in step S151 that the data does not match the data pattern (01110111), and when it is determined in step S152 that the minimum run successive occurrence limiting total flag (2) is not on (when the minimum run successive occurrence limiting total flag (2) is off) (when the one channel bit of the immediately preceding codeword string is "0"), the specific rule conversion pattern detecting unit 115 in step S155 outputs the specific rule conversion pattern detection flag in an off state.

Details of the conversion pattern detecting process in step S6 in FIG. 4 will next be described with reference to a flowchart of FIG. 9.

In step S211, the conversion pattern detecting unit 121 determines whether the data input from the shift register 42 matches a data pattern (00001000) or (00000000). When the input data matches the data pattern (00001000) or (00000000), the conversion pattern detecting unit 121 in step S212 outputs conversion pattern determining information for eight-piece data/12 channel bits. This information is supplied to the conversion pattern determining unit 53 and the conversion tables 122A to 122D. In step 5213, the conversion table 122D converts the eight-piece data to 12 channel bits. Then, the 12 channel bits are supplied to the conversion pattern determining unit 53. Specifically, when the input data matches the data pattern (00001000) or (00000000), a code string "000 100 100 100" or "010 100 100 100", respectively, is output. The information output in step S212 is used in step S371 in FIG. 14 to be described later. The code string converted in step S213 is selected and output in step S372.

When it is determined in step S211 that the input data does not match the data pattern (00001000) or (00000000), the conversion pattern detecting unit 121 in step S214 determines whether the input data matches a data pattern (000011), (000010), (000001), or (000000). When the input data matches one of the four data patterns, the conversion pattern detecting unit 121 in step S215 outputs determining information for six-piece data/nine channel bits to the conversion pattern determining unit 53 and the conversion tables 122A to 122D. In step 5216, the conversion table 122C converts the six-piece data to nine channel bits. The conversion table 122C then outputs the nine channel bits to the conversion pattern determining unit 53. Specifically, when the input data is one of the four data patterns (000011), (000010), (000001), and (000000), a code string "000 100 100", "000 100 000", "010 100 100", or "010 100 000", respectively, is output. The information output in step S215 is used in step S373 in FIG. 14. The code string converted in step S216 is selected and output in step S374.

When it is determined in step S214 that the input data does not match any of the data pattern (000011), (000010), (000001), and (000000), the conversion pattern detecting unit 121 in step S217 determines whether the input data matches a data pattern (0011), (0010), or (0001). When the input data matches one of the three data patterns, the conversion pattern detecting unit 121 in step S218 outputs conversion pattern determining information for four-piece data/six channel bits to the conversion pattern determining unit 53 and the conversion tables 122A to 122D. In step S219, the conversion table 122B converts the four-piece data to six channel bits. The conversion table 122B then outputs the six channel bits to the conversion pattern determining unit 53. Specifically, when the input data matches the data pattern (0011), a code string "010 100" is output. When the input data matches the data pattern (0010), a code string "010 000" is output. When the input data matches the data pattern (0001), a code string "000 100" is output. The information output in step S218 is used in step S375 in FIG. 14. The code string converted in step S219 is selected and output in step S376.

When it is determined in step S217 that the input data does not match any of the data patterns (0011), (0010), and (0001), the conversion pattern detecting unit 121 in step S220 determines whether the input data matches a data pattern (11), (10), or (01). When the input data matches one of the three data patterns, the conversion pattern detecting unit 121 in step S221 outputs conversion pattern determining information for two-piece data/three channel bits to the conversion pattern determining unit 53 and the conversion tables 122A to 122D. This information is used in steps S377 and S378 in FIG. 14.

In step S222, the conversion pattern detecting unit 121 determines whether the input two-piece data matches the data pattern (11). When the input data matches the data pattern (11), the conversion pattern detecting unit 121 in step S223 outputs indeterminate pattern identifying information to the selector 123. The indeterminate pattern identifying information is used in step S252 in FIG. 10 to be described later.

When it is determined in step S222 that the input data does not match the data pattern (11), the process of step S223 is skipped. After the process of step S223, or when it is determined in step S222 that the input data does not match the data pattern (11), the conversion table 122A in step S224 performs two-piece data/three channel bits processing. Details of the two-piece data/three channel bits processing are shown in a flowchart of FIG. 10.

Figure 10:
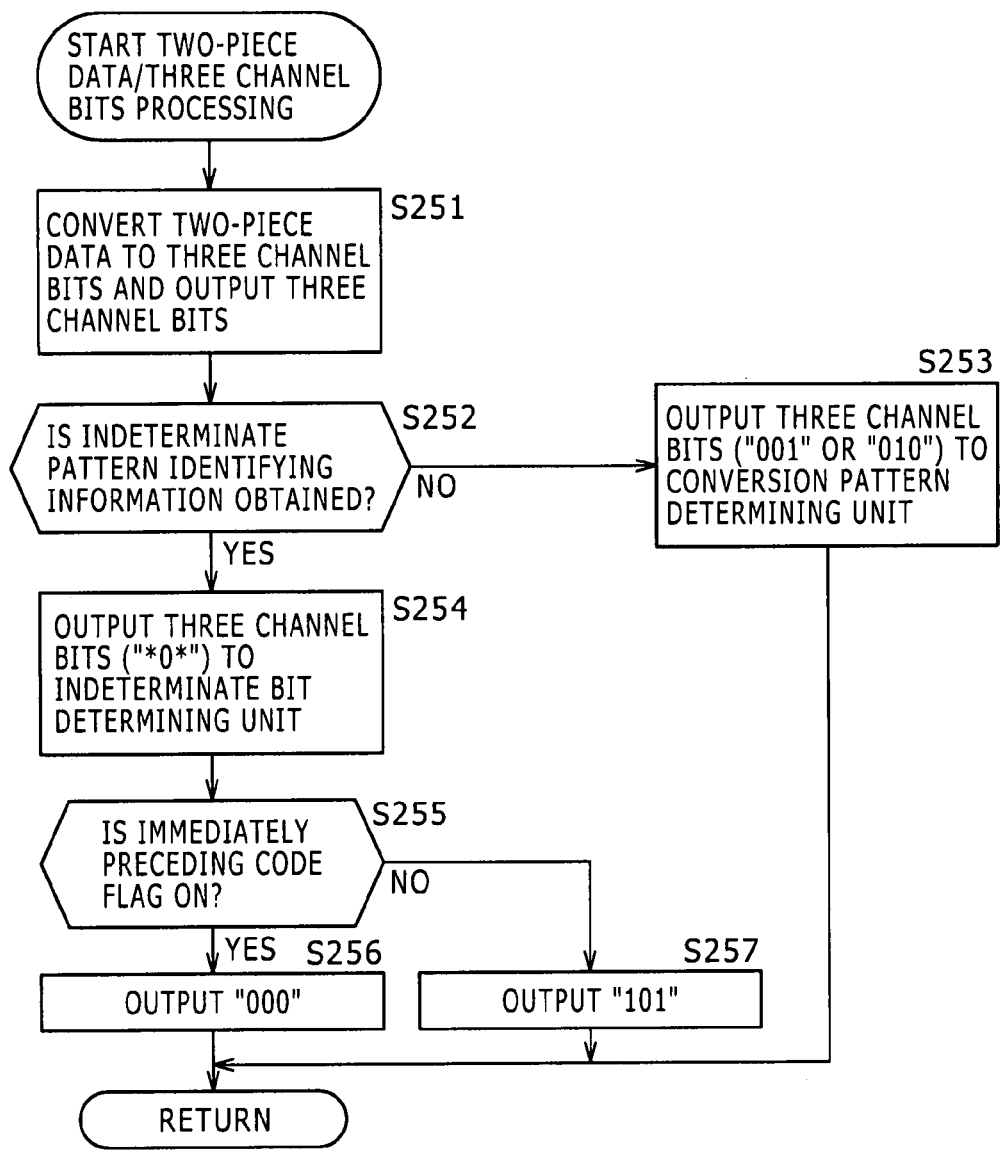
FIG. 10 is a flowchart of assistance in explaining two-piece data/three channel bits processing in step S224 in FIG. 9.

Details of the two-piece data/three channel bits processing in step S224 in FIG. 9 will next be described with reference to the flowchart of FIG. 10.

In step S251, the conversion table 122A converts the two-piece data to three channel bits, and then outputs the three channel bits to the selector 123.

Specifically, the conversion table 122A outputs a codeword string "*0*" when the input data matches the data pattern (11). The conversion table 122A outputs a codeword string "001" when the input data matches the data pattern (10). The conversion table 122A outputs a codeword string "010" when the input data matches the data pattern (01).

In step S252, the selector 123 determines whether the indeterminate pattern identifying information is obtained. When the indeterminate pattern identifying information (output in step S223 in FIG. 9) is not obtained from the conversion pattern detecting unit 121, the selector 123 in step S253 outputs the three channel bits to the conversion pattern determining unit 53. Specifically, the channel bits "001" or "010" that is input from the conversion table 122A and does not include an indeterminate bit from the beginning is output to the conversion pattern determining unit 53. The code string output in step S253 is selected and output in step S380 in FIG. 14.

On the other hand, when it is determined in step S252 that the indeterminate pattern identifying information is obtained from the conversion pattern detecting unit 121, the selector 123 in step S254 outputs the three channel bits ("*0*") to the indeterminate bit determining unit 124. The indeterminate bit determining unit 124 in step S255 determines whether the immediately preceding code flag is on. This immediately preceding code flag is supplied from the immediately preceding code detection unit 81 on the basis of the process of step S303 or S304 in FIG. 11 to be described later. When the immediately preceding code flag is on (when one channel bit of an immediately preceding codeword string is "1"), the indeterminate bit determining unit 124 in step S256 outputs a codeword "000" to the conversion pattern determining unit 53. On the other hand, when the immediately preceding code flag is not on (when the immediately preceding code flag is off) (when the one channel bit of the immediately preceding codeword string is "0"), the indeterminate bit determining unit 124 in step S257 outputs a codeword "101" to the conversion pattern determining unit 53. The code string output in step S256 or S257 is selected and output in step S379 in FIG. 14.

Figure 11:
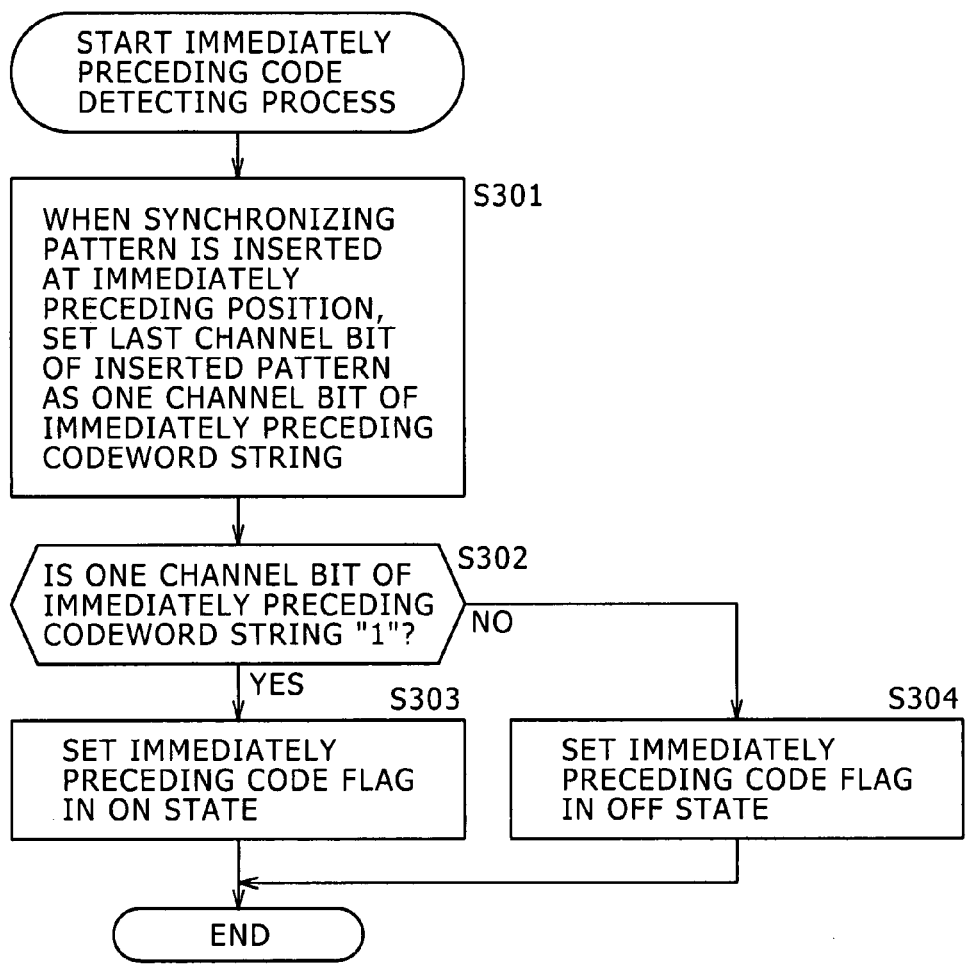
FIG. 11 is a flowchart of assistance in explaining an immediately preceding code detecting process.
Figure 12:
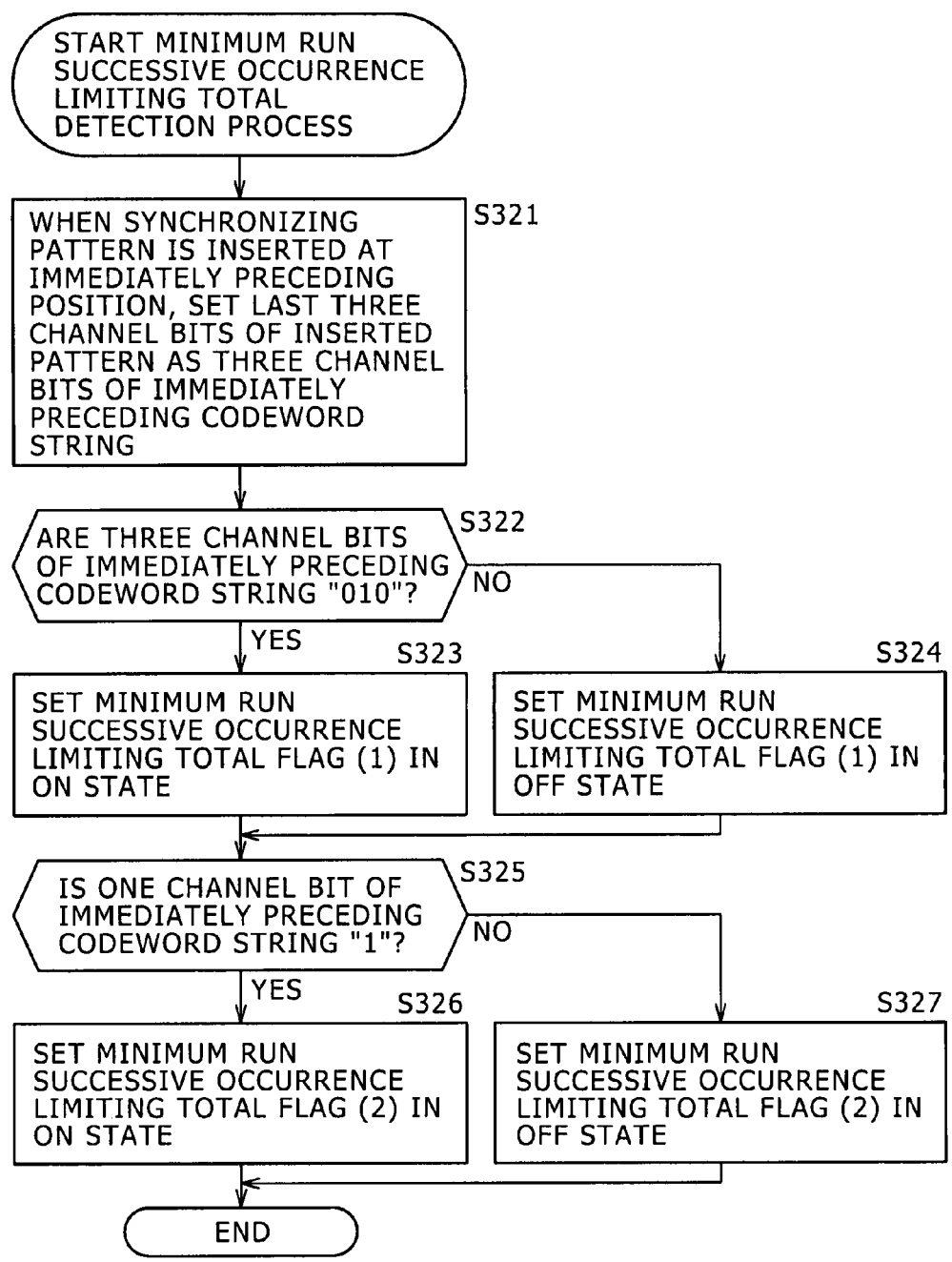
FIG. 12 is a flowchart of assistance in explaining a minimum run successive occurrence limiting total detection process.

The processes of the immediately preceding code detection unit 81 and the total detection unit 82 will next be described with reference to flowcharts of FIG. 11 and FIG. 12.

The immediately preceding code detecting process of the immediately preceding code detection unit 81 will first be described with reference to the flowchart of FIG. 11.

In step S301, when a synchronizing pattern is inserted at an immediately preceding position, the immediately preceding code detection unit 81 sets a last channel bit of the inserted pattern as one channel bit of an immediately preceding codeword string. Specifically, the immediately preceding code detection unit 81 determines whether a synchronizing pattern is inserted on the basis of output from the synchronizing pattern inserting unit 23. When a synchronizing pattern is inserted, the immediately preceding code detection unit 81 selects one last channel bit of the inserted pattern (synchronizing pattern) as one channel bit of the immediately preceding codeword string for determination in next step S302.

In step S302, the immediately preceding code detection unit 81 determines from the code string finally determined by the conversion pattern determining unit 53 whether one channel bit of the code string immediately preceding data to be subjected to a next conversion process is "1". When the one channel bit of the immediately preceding code string is "1", the immediately preceding code detection unit 81 in step S303 outputs the immediately preceding code flag in an on state. On the other hand, when it is determined in step S302 that the one channel bit of the immediately preceding code string is not "1" (when it is determined that the one channel bit of the immediately preceding code string is "0"), the immediately preceding code detection unit 81 in step S304 outputs the immediately preceding code flag in an off state. The immediately preceding code flag is output to the indeterminate bit determining unit 124 and the indeterminate bit determining unit 114, and used in step S92 in FIG. 7 and step S255 in FIG. 10.

The minimum run successive occurrence limiting total detection process of the total detection unit 82 will next be described with reference to the flowchart of FIG. 12.

In step S321, when a synchronizing pattern is inserted at an immediately preceding position, the total detection unit 82 sets last three channel bits of the inserted pattern as three channel bits of an immediately preceding codeword string. Specifically, the total detection unit 82 determines whether a synchronizing pattern is inserted on the basis of output from the synchronizing pattern inserting unit 23. When a synchronizing pattern is inserted, the total detection unit 82 selects last three channel bits of the inserted pattern (synchronizing pattern) as three channel bits of the immediately preceding codeword string for determination in next step S322.

In step S322, the total detection unit 82 determines from the code string finally determined by the conversion pattern determining unit 53 whether the three channel bits of the code string immediately preceding data to be subjected to a next conversion process are "010". When the three channel bits of the immediately preceding code string are "010", the total detection unit 82 in step S323 outputs the minimum run successive occurrence limiting total flag (1) in an on state. On the other hand, when it is determined in step S322 that the three channel bits of the immediately preceding code string is not "010" (when it is determined that the three channel bits of the immediately preceding code string are "000", "101", or "001"), the total detection unit 82 in step S324 outputs the minimum run successive occurrence limiting total flag (1) in an off state. The minimum run successive occurrence limiting total flag (1) is output to the indeterminate bit determining unit 114, and used in step S93 in FIG. 7.

In step S325, the total detection unit 82 determines from the code string finally determined by the conversion pattern determining unit 53 whether one channel bit of the code string immediately preceding the data to be subjected to the next conversion process is "1". When the one channel bit of the immediately preceding code string is "1", the total detection unit 82 in step S326 outputs the minimum run successive occurrence limiting total flag (2) in an on state. On the other hand, when it is determined in step S325 that the one channel bit of the immediately preceding code string is not "1" (when it is determined that the one channel bit of the immediately preceding code string is "0"), the total detection unit 82 in step S327 outputs the minimum run successive occurrence limiting total flag (2) in an off state. The minimum run successive occurrence limiting total flag (2) is output to the specific rule conversion pattern detecting unit 115, and used in step S152 in FIG. 8.

The substitution pattern processing control process in step S7 in FIG. 4 will next be described with reference to FIG. 13. In step S331, the substitution pattern processing control unit 54 clears a count (count 1 and count 2) at predetermined intervals. That is, variables count 1 and count 2 to be used in steps S334 and S340 to be described later are initialized in step S331. This process is performed in each ECC (Error-Correcting Code) block as a unit of code string error correction, for example.

In step S332, the substitution pattern processing control unit 54 determines whether the minimum run successive occurrence limiting pattern detection flag (10-piece data) is on. This flag is output in step S73 or S77 in FIG. 6. When the minimum run successive occurrence limiting pattern detection flag (10-piece data) is on (when the data matches a data pattern (1001110111)), the substitution pattern processing control unit 54 in step S333 determines whether the prediction flag (D5) is on. This flag is output in step S54 or S58 in FIG. 5.

When the prediction flag (D5) is not on (the prediction flag (D5) is off) (when the data does not match the data pattern (xxxx110111) or in a case where the next channel bits are not "010" even when the data matches the data pattern (xxxx110111)), the substitution pattern processing control unit 54 in step S334 increments the variable count 1 by one (count 1=count 1+1). In step S335, the substitution pattern processing control unit 54 determines whether (count 1+count 2) is equal to or higher than a reference count. When the count value (count 1+count 2) is lower than the predetermined reference count (reference value), the substitution pattern processing control unit 54 in step S337 sets the substitution pattern control flag (1) in an on state. On the other hand, when the count value (count 1+count 2) is equal to or higher than the reference value, when it is determined in step S332 that the minimum run successive occurrence limiting pattern detection flag (10-piece data) is off, and when it is determined in step S333 that the prediction flag (D5) is on, the substitution pattern processing control unit 54 in step S336 sets the substitution pattern control flag (1) in an off state.

Further, after the process of step S336 or S337, the substitution pattern processing control unit 54 in step S338 determines whether the specific rule conversion pattern detection flag is on. This flag is output in step S153 or S155 in FIG. 8. When the specific rule conversion pattern detection flag is on (when the data matches a data pattern (01110111) and the immediately preceding code is "1"), the substitution pattern processing control unit 54 in step S339 determines whether the prediction flag (D3) is on. This flag is output in step S57 or S58 in FIG. 5.

When the prediction flag (D3) is not on (the prediction flag (D5) is off) (when the data does not match the data pattern (xx110111) or in a case where the next channel bits are not "010" even when the data matches the data pattern (xx110111)), the substitution pattern processing control unit 54 in step S340 increments the variable count 2 by one (count 2=count 2+1). In step S341, the substitution pattern processing control unit 54 determines whether (count 1+count 2) is equal to or higher than the reference count. When the count value (count 1+count 2) is lower than the reference value, the substitution pattern processing control unit 54 in step S343 sets the substitution pattern control flag (2) in an on state. On the other hand, when the count value (count 1+count 2) is equal to or higher than the reference value, when it is determined in step S338 that the specific rule conversion pattern detection flag is off, and when it is determined in step S339 that the prediction flag (D3) is on, the substitution pattern processing control unit 54 in step S342 sets the substitution pattern control flag (2) in an off state.

The variable count 1 represents the number of occurrences of a state in which the minimum run successive occurrence limiting pattern detection flag (10-piece data) is on and the prediction flag (D5) is off, that is, the number of times (use frequency) that the data pattern (1001110111) is converted to the corresponding code pattern "$0$ 010 000 000 101" within an ECC block, for example. The variable count 2 represents the number of occurrences of a state in which the specific rule conversion pattern detection flag is on and the prediction flag (D3) is off, that is, the number of times (use frequency) that the parity preservation violating data pattern (01110111) is converted to the corresponding parity preservation violating code pattern "010 000 000 101". The count value (count 1+count 2) amounts to the number of times that pattern conversion is performed according to the conversion table of Table 4.

Figure 6:
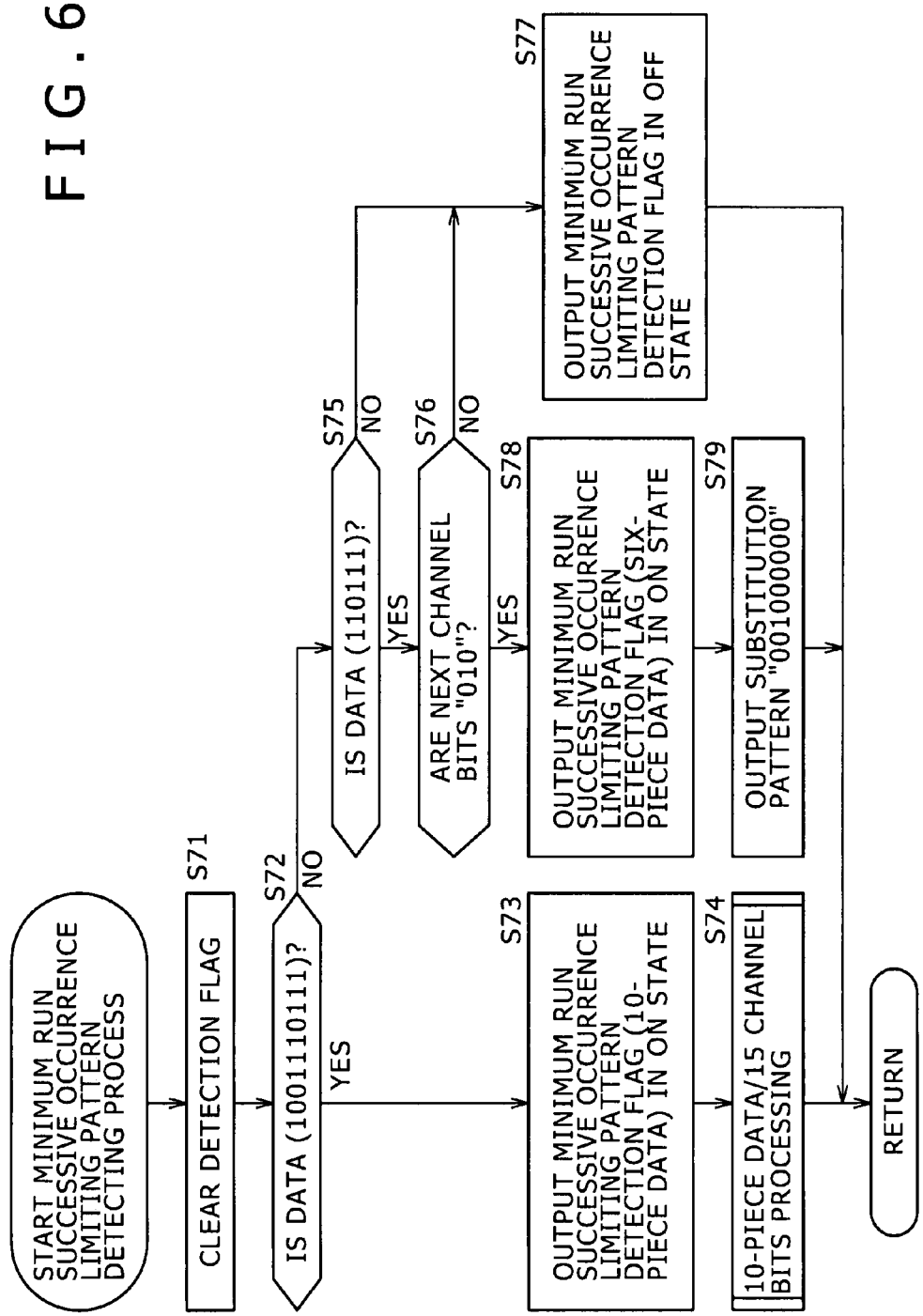
FIG. 6 is a flowchart of assistance in explaining a minimum run successive occurrence limiting pattern detecting process in step S4 in FIG. 4.

As will be described later with reference to FIG. 14, when the substitution pattern control flag (1) (permission flag) is on, the code pattern "$0$ 010 000 000 101" ("101 010 000 000 101" or "000 010 000 000 101") obtained by converting the data pattern (1001110111) in step S74 in FIG. 6 is selected and output in steps S363 and S364 (that is, the conversion of a part that cannot be demodulated by a demodulating device corresponding to the conversion table of Table 2 is performed). On the other hand, when the substitution pattern control flag (1) (permission flag) is off, the code pattern "101 010 000 000 101" or "000 010 000 000 101" is not selected, but a code pattern obtained by converting the data pattern (1001110111) individually (a code pattern obtained by converting the data pattern (1001110111) as data patterns (10), (01), (11), (01), and (11)) is selected and output (that is, the conversion of a part that can be demodulated by a demodulating device corresponding to the conversion table of Table 2 is performed).

Figure 8:
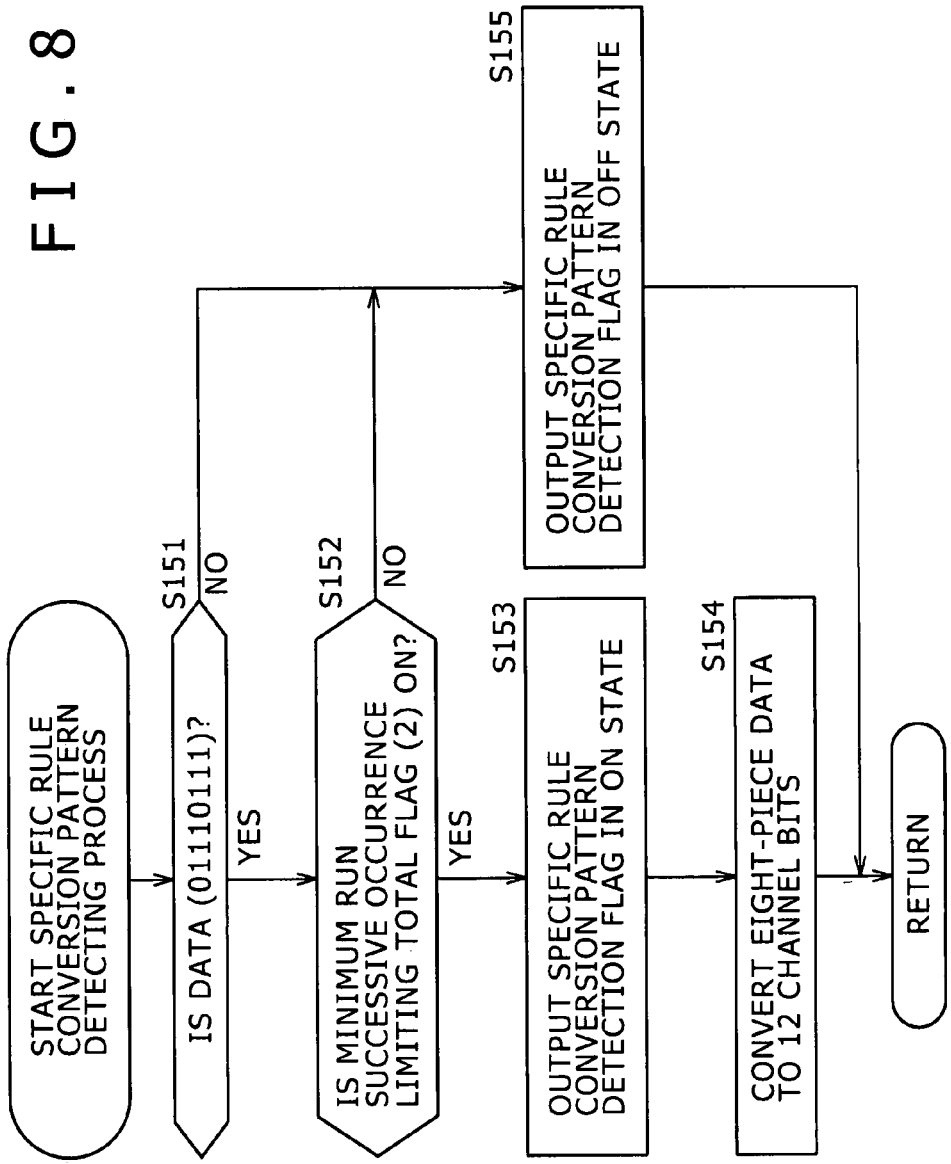
FIG. 8 is a flowchart of assistance in explaining a specific rule conversion pattern detecting process in step S5 in FIG. 4.
Figure 14:
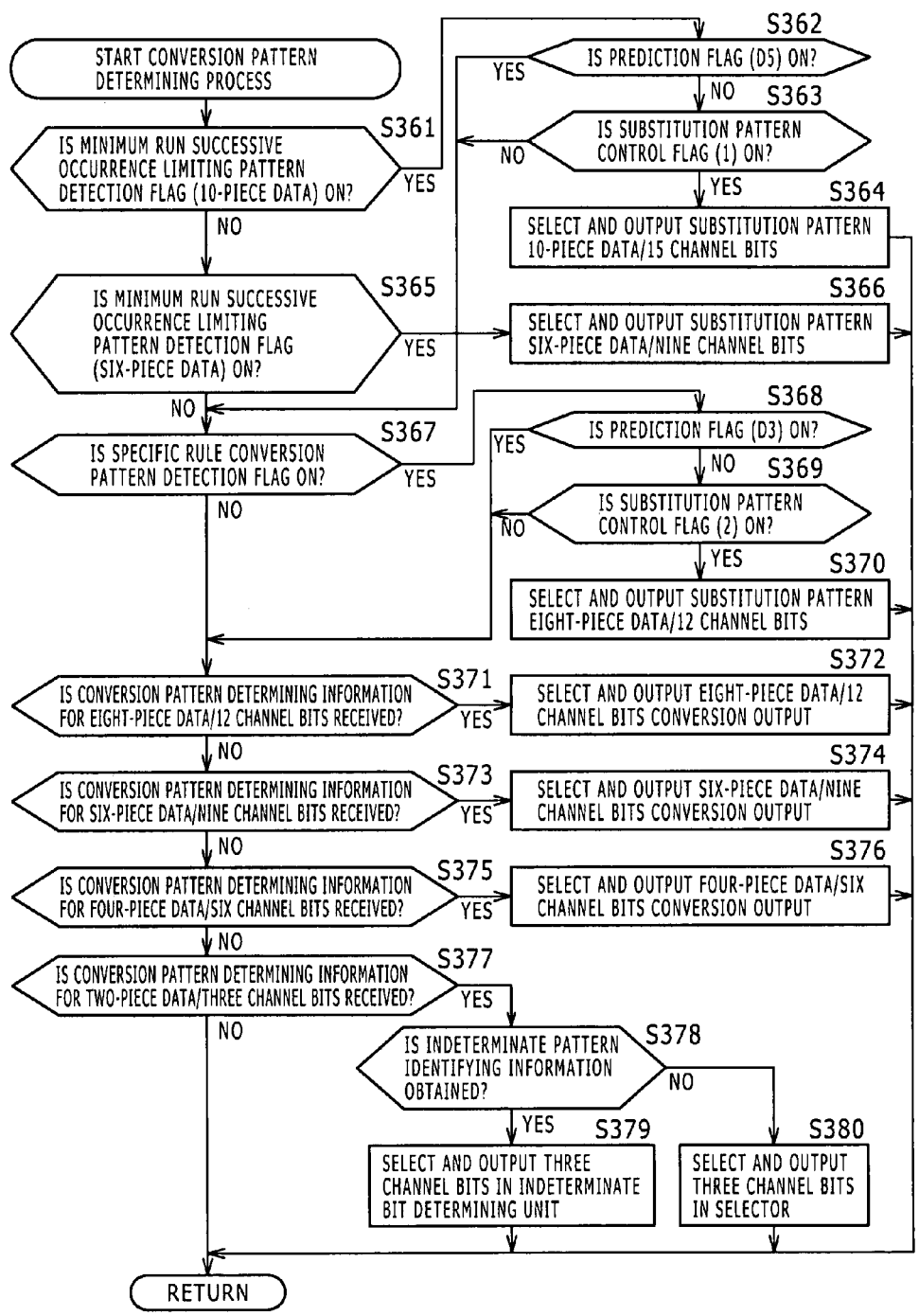
FIG. 14 is a flowchart of assistance in explaining a conversion pattern determining process in step S8 in FIG. 4.

Similarly, when the substitution pattern control flag (2) (permission flag) is on, the code pattern "010 000 000 101" obtained by converting the data pattern (01110111) in step S154 in FIG. 8 is selected and output in steps S369 and S370 in FIG. 14 (that is, the conversion of a part that cannot be demodulated by a demodulating device corresponding to the conversion table of Table 2 is performed). On the other hand, when the substitution pattern control flag (2) (permission flag) is off, the code pattern "010 000 000 101" is not selected, but a code pattern obtained by converting the data pattern (01110111) individually (a code pattern obtained by converting the data pattern (01110111) as data patterns (01), (11), (01), and (11)) is selected and output (that is, the conversion of a part that can be demodulated by a demodulating device corresponding to the conversion table of Table 2 is performed).

A result of conversion of a part that cannot be demodulated by a demodulating device corresponding to the conversion table of Table 2 (existing device) is a demodulation error. Accordingly, a predetermined value within a range in which errors occurring in an ECC block, for example, can be corrected is set in advance as the reference count to be compared with the count value (count 1+count 2) in steps S335 and S341 in FIG. 13. Thereby, even when the conversion of a part that cannot be demodulated by the existing device is performed, the original data string can be obtained by an error correction process in the ECC block.

That is, when a new conversion table having a part common to an existing conversion table is developed by improving the existing conversion table, code modulated (converted) on the basis of the improved conversion table can be demodulated by a device that does not essentially have a function of demodulating the improved code and demodulates codes before the improvement.

Incidentally, in the present embodiment, Table 4 is formed by the minimum run successive occurrence limiting table 113B and the specific rule conversion table 116, whereas Table 2 to be provided with reproduction compatibility (table possessed by an existing modulating device (existing device)) is formed by the conversion table 122 (122A to 122D) and the minimum run successive occurrence limiting table 113A. As a whole, Table 3 is formed.

Details of the conversion pattern determining process in step S8 in FIG. 4 will next be described with reference to a flowchart of FIG. 14.

In step S361, the conversion pattern determining unit 53 determines whether the minimum run successive occurrence limiting pattern detection flag (10-piece data) is on. The minimum run successive occurrence limiting pattern detection flag (10-piece data) is output by the minimum run successive occurrence limiting pattern detecting unit 112 in step S73 or S77 in FIG. 6. When the minimum run successive occurrence limiting pattern detection flag (10-piece data) is on (when the input data matches a data pattern (1001110111)), the conversion pattern determining unit 53 in step S362 determines whether the prediction flag (D5) is on. This prediction flag (D5) is output by the minimum run successive occurrence limiting pattern detection predicting unit 111 in step S54 or S58 in FIG. 5.

When the prediction flag (D5) is not on (when the prediction flag (D5) is off) (when the input data string does not match a data pattern (xxxx110111), or in a case where next channel bits are not "010" even when the input data string matches the data pattern (xxxx110111)), the conversion pattern determining unit 53 in step S363 determines whether the substitution pattern control flag (1) is on. This flag is output by the substitution pattern processing control unit 54 in step S336 or S337 in FIG. 13. When the substitution pattern control flag (1) is on (when the count value (count 1+count 2) is lower than the reference value (reference count)), conversion to (use of) the code pattern "$0$ 010 000 000 101" is permitted. Accordingly, the conversion pattern determining unit 53 in step S364 selects and outputs a substitution pattern 10-piece data/15 channel bits. Specifically, the code pattern "101 010 000 000 101" or "000 010 000 000 101" output in step S95 or S97 in FIG. 7 is selected and output.

On the other hand, when the substitution pattern control flag (1) is off (when the count value (count 1+count 2) is equal to or higher than the reference value), the process of step S364 is not performed.

When it is determined in step S361 that the minimum run successive occurrence limiting pattern detection flag (10-piece data) is not on (the minimum run successive occurrence limiting pattern detection flag (10-piece data) is off) (when it is determined that the data pattern of the input data is not (1001110111)), the conversion pattern determining unit 53 in step S365 determines whether the minimum run successive occurrence limiting pattern detection flag (six-piece data) is on. This minimum run successive occurrence limiting pattern detection flag (six-piece data) is output in step S78 in FIG. 6 when the data pattern is (110111) and the next three channel bits are "010". When it is determined in step S365 that the minimum run successive occurrence limiting pattern detection flag (six-piece data) is on (when the data pattern is (110111) and the next three channel bits are "010"), the conversion pattern determining unit 53 in step S366 selects and outputs the conversion output of a substitution pattern six-piece data/nine channel bits. That is, the substitution pattern "001 000 000" converted in step S79 in FIG. 6 is selected and output.

When it is determined in step S365 that the minimum run successive occurrence limiting pattern detection flag (six-piece data) is off (when the input data is not the data pattern (110111), or in a case where the next channel bits are not "010" even when the input data is the data pattern (110111)), when it is determined in step S362 that the prediction flag (D5) is on (when the data matches the data pattern (1001110111) and further the data is (xxxx110111) and the next channel bits are "010"), and when it is determined in step S363 that the substitution pattern control flag (1) is off (when the count value (count 1+count 2) is equal to or higher than the reference value (reference count)), the conversion pattern determining unit 53 in step S367 determines whether the specific rule conversion pattern detection flag is on. This flag is set in an on state in step S153 in FIG. 8 when the data matches the data pattern (01110111) and the immediately preceding code is "1".

When the specific rule conversion pattern detection flag is on (when the data matches the data pattern (01110111) and the immediately preceding code is "1"), the conversion pattern determining unit 53 in step S368 determines whether the prediction flag (D3) is on. This prediction flag (D3) is output by the minimum run successive occurrence limiting pattern detection predicting unit 111 in step S57 or S58 in FIG. 5.

When the prediction flag (D3) is not on (the prediction flag (D3) is off) (when the input data string does not match the data pattern (xx110111), or in a case where the next channel bits are not "010" even when the input data string matches the data pattern (xx110111)), the conversion pattern determining unit 53 in step S369 determines whether the substitution pattern control flag (2) is on. This flag is output by the substitution pattern processing control unit 54 in step S342 or S343 in FIG. 13. When the substitution pattern control flag (2) is on (when the count value (count 1+count 2) is lower than the reference value (reference count)), conversion to (use of) the code pattern "010 000 000 101" is permitted. Accordingly, the conversion pattern determining unit 53 in step S370 selects and outputs a substitution pattern eight-piece data/12 channel bits. Specifically, the substitution pattern "010 000 000 101" output in step S154 in FIG. 8 is selected and then output to the synchronizing pattern inserting unit 23. On the other hand, when the substitution pattern control flag (2) is off (when the count value (count 1+count 2) is equal to or higher than the reference value), the process of step S370 is not performed.

When it is determined in step S367 that the specific rule conversion pattern detection flag is off (the data does not match the data pattern (01110111)), when it is determined in step S368 that the prediction flag (D3) is on (when the data matches the data pattern (01110111) and the immediately preceding code is "1" and further the data is (xx110111) and the next channel bits are "010"), and when it is determined in step S369 that the substitution pattern control flag (2) is off (when the count value (count 1+count 2) is equal to or higher than the reference value (reference count)), the conversion pattern determining unit 53 in step S371 determines whether conversion pattern determining information for eight-piece data/12 channel bits is received. This determining information is output in step S212 in FIG. 9. When the conversion pattern determining information for eight-piece data/12 channel bits is received, the conversion pattern determining unit 53 in step S372 selects and outputs an eight-piece data/12 channel bits conversion output. That is, the channel bit string "000 100 100 100" or "010 100 100 100" converted in step S213 in FIG. 9 are selected and output.

When it is determined in step S371 that the conversion pattern determining information for eight-piece data/12 channel bits is not received, the conversion pattern determining unit 53 in step S373 determines whether conversion pattern determining information for six-piece data/nine channel bits is received. This determining information is output in step S215 in FIG. 9. When the conversion pattern determining information for six-piece data/nine channel bits is received, the conversion pattern determining unit 53 in step S374 selects and outputs a six-piece data/nine channel bits conversion output. That is, the channel bits "000 100 100", "000 100 000", "010 100 100", or "010 100 000" output in step S216 in FIG. 9 is selected and output.

When it is determined in step S373 that the conversion pattern determining information for six-piece data/nine channel bits is not received, the conversion pattern determining unit 53 in step S375 determines whether conversion pattern determining information for four-piece data/six channel bits is received. This determining information is output in step S218 in FIG. 9. When the conversion pattern determining information for four-piece data/six channel bits is received, the conversion pattern determining unit 53 in step S376 selects and outputs a four-piece data/six channel bits conversion output. That is, the channel bits "010 100", "010 000", or "000 100" output in step S219 in FIG. 9 are selected and output.

When it is determined in step S375 that the conversion pattern determining information for four-piece data/six channel bits is not received, the conversion pattern determining unit 53 in step S377 determines whether conversion pattern determining information for two-piece data/three channel bits is received from the conversion pattern detecting unit 121. This information is output in step S221 in FIG. 9. When the conversion pattern determining information for two-piece data/three channel bits is received, the conversion pattern determining unit 53 in step S378 further determines whether the conversion pattern determining information for two-piece data/three channel bits is conversion pattern determining information for data (11). That is, whether the data is the data pattern to be converted to codes including an indeterminate code is determined. When it is determined that the conversion pattern determining information for the data (11) is received, the conversion pattern determining unit 53 in step S379 selects and outputs the three channel bits of the indeterminate bit determining unit 124. Specifically, the three channel bits "000" or "101" output in step S256 or S257 in FIG. 10 is selected and output.

On the other hand, when it is determined in step S378 that the conversion pattern determining information for two-piece data/three channel bits is not the conversion pattern determining information for the data (11) (when it is determined that the channel bits are not the channel bits of the data to be converted to the codes including the indeterminate code), the conversion pattern determining unit 53 in step S380 selects and outputs the three channel bits of the selector. Specifically, in this case, the code pattern "001" or "010" in step S253 in FIG. 10 is selected and output.

When the conversion pattern is determined as described above, the data string in the shift register 42 is shifted by an amount corresponding to the determined channel bits, and a process of determining a conversion pattern for next data is performed.

As described above, a modulation table and a modulating device can be realized which have a basic constitution similar to the 1,7PP code, that is, have a minimum run d=1, a maximum run k=7, and a conversion ratio (m:n)=(2:3), perform DSV control efficiently by inserting one DSV control bit at a predetermined position in a data string, and improve an error propagation characteristic at times of recording and reproduction by limiting the number of successive occurrences of the minimum run even when a synchronizing pattern having a predetermined identifying bit is inserted.

Further, within the interval of a predetermined ECC block, the number of times that the conversions in Table 4 are performed is counted. A flag is on (permission) before the number of times that the conversions in Table 4 are performed reaches a reference count. The flag is turned off (prohibition) when the number of times that the conversions in Table 4 are performed becomes equal to or larger than the reference count. Thus, the frequency of conversion of the substitution patterns in Table 4 can be managed so as to provide reproduction compatibility.

That is, by performing modulation processing based on Table 3, it is possible to reduce parts where the minimum run occurs successively, which parts tend to be an error pattern at times of recording and reproduction, and thus provide a more stable system. Further, because demodulation can be performed by using not only the demodulating device based on Table 3 but also the demodulating device based on Table 2, the already commercialized demodulating device having a format including Table 2, for example, can reproduce code strings recorded using a format including Table 3 by the present invention.

Based on Table 3, the specific rule conversion pattern detecting unit 115 detects that data matches (01110111) and further the last codeword of the immediately preceding determined conversion pattern or synchronizing pattern is "1" (minimum run successive occurrence limiting total flag (2)). However, this may be changed so that using the position of a synchronizing pattern inserted at a predetermined interval as information, the specific rule conversion pattern detecting unit 115 detects that the data matches (01110111) at a position immediately succeeding the inserted synchronizing pattern.

Then, the table is changed at the destinations to which the flags output by the immediately preceding code detection unit 81 and the total detection unit 82 are supplied, and when the positions of indeterminate codes are changed, it suffices to supply the flags to the changed positions.

In addition, the indeterminate codes $ and * may be determined using not only the immediately preceding code but also immediately succeeding code to satisfy desired conditions for the table.

Figure 13:
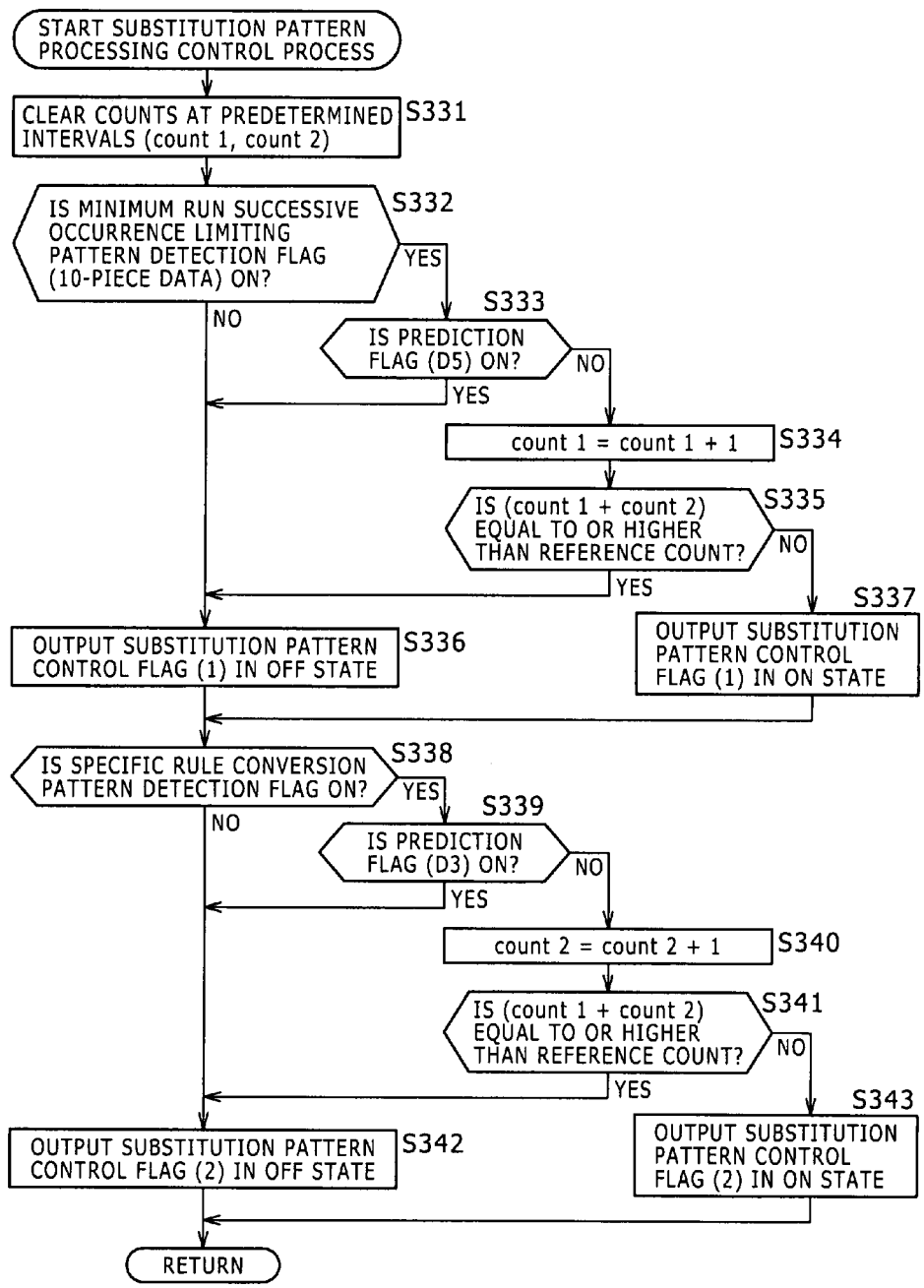
FIG. 13 is a flowchart of assistance in explaining a substitution pattern processing control process in step S7 in FIG. 4.

Further, in the substitution pattern processing control process of FIG. 13, different weights may be assigned to the prohibitions of use of the two conversion patterns in Table 4, or one of the conversion patterns may be prohibited completely. In this case, it suffices to set separate reference counts, that is, a reference count (1) and a reference count (2), in FIG. 13.

In addition, the modulating device including Table 3 can output codeword strings based on the format of Table 2. For example, the substitution pattern processing control unit 54 in FIG. 3 outputs information prohibiting conversion processing on the substitution patterns on the basis of a not shown external control signal. Thus, substitution processing is prohibited in the conversion pattern determining unit 53, and output from the conversion pattern determining unit 53 can be made to be a codeword string based on Table 2.

The processing operation of the substitution pattern processing control unit 54 in this case changes the substitution pattern control flag (1) and the substitution pattern control flag (2) on the basis of the external control signal. Thus, the process in FIG. 13 can be represented by a simple flowchart in which the outputting of the substitution pattern control flags (1) and (2) according to the external control signal is performed as follows.

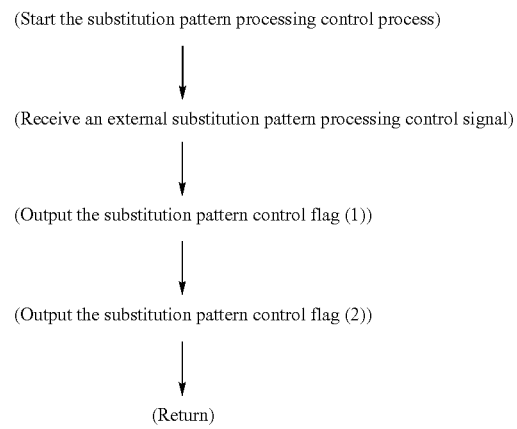

On the other hand, the operation in FIG. 13 is unchanged.

In addition, it suffices to perform the following process when the functions of FIG. 13 are to be realized while the substitution pattern control flags (1) and (2) can be fixed to an off state according to the external control signal.

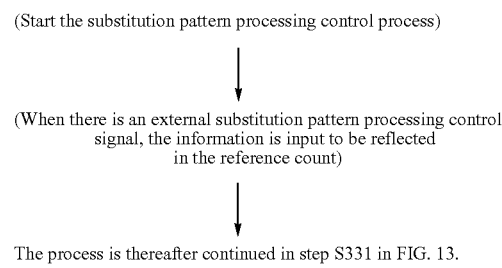

That is, when the substitution pattern control flags (1) and (2) are to be fixed to an off state, it suffices to set the reference count in FIG. 13 to zero.

For example, information on the recording densities of a disk that is to have compatibility and a disk that does not need to have compatibility is obtained as external control signal. Control can be performed to set the substitution pattern control flags (1) and (2) in an on state at all times when the recording density of the disk that is to have compatibility is higher than the recording density of the disk that does not need to have compatibility, and to set the substitution pattern control flags (1) and (2) in an on or off state according to FIG. 13 when the recording density of the disk that is to have compatibility is lower than the recording density of the disk that does not need to have compatibility. In addition, when a disk has a hybrid structure in which a part that is to have compatibility and a part that does not need to have compatibility are mixed with each other, each part is identified on the basis of an identifying flag, and control can be performed to set the substitution pattern control flags (1) and (2) in an on state at all times in the part that does not need to have compatibility, and to set the substitution pattern control flags (1) and (2) in an on or off state according to FIG. 13 in the part that is to have compatibility. Information on these disks can be obtained from TOC (Table of Contents) information in header information recorded at a header position on the disks, for example.

Further, when a period for which compatibility is ensured and compatibility is provided up to a certain time limit, control can be performed on the basis of temporal information of a built-in clock or the like to set the substitution pattern control flags (1) and (2) in an on or off state according to FIG. 13 up to the certain time limit, and to set the substitution pattern control flags (1) and (2) in an on state at all times past the time limit. Alternatively, this control can be performed on the basis of external control information from a LAN (Local Area Network) or the like.

While the above description has been made by taking Table 3 as a concrete example, the present invention is not limited to Table 3. When there are two tables, that is, Table A and Table B, and there is a conversion rule in Table B which rule is not included in Table A, the present invention is applied to enable a codeword string generated by a modulating device including Table B to be demodulated even by a demodulating device including Table A.

The 1,7PP code has substitution patterns for limiting the number of times that a minimum run length is repeated in the conversion table with a minimum run d=1, a maximum run k=7 and a conversion ratio (m:n)=2:3, thus providing the following effects.

(1) Recording and reproduction at a high linear density and a tolerance for a tangential tilt are improved.

(2) The number of parts with low signal levels is reduced, accuracy of waveform processing of AGC (Auto Gain Control), a PLL (Phase-Locked Loop) and the like is improved, and therefore overall characteristics can be enhanced.

(3) It is possible to make a design with shorter path memory lengths in Viterbi decoding or the like, and thus reduce a circuit scale, as compared with an existing system.

In addition, by making a DSV control section have a predetermined length or more, at a position where a DSV control bit is inserted, a remainder when the number of "1"s of a data string forming a conversion pattern in the modulation table is divided by two and a remainder when the number of "1"s of a codeword string is divided by two are both 1 or 0 and thus equal to each other, providing the following effects.

(4) The number of redundant bits for DSV control can be reduced.

(5) At a minimum run d=1 and (m, n)=(2, 3), DSV control can be performed with 1.5 codewords.

(6) In addition to a low level of redundancy, the minimum run and the maximum run can be kept. Further, Table 3 reduces the limited number of successive occurrences of the minimum run from six to five as compared with the 1,7PP code of Table 2, and can therefore further reduce error propagation at times of data recording and reproduction.

As described above, as a pattern of data reproduction errors, an error in which an entire length of successive smallest marks from a first edge to a last edge is shifted can occur. That is, the length of a bit error that occurs extends from a start to an end of the section of the successive smallest marks. Therefore a problem of a long error propagation occurs. By limiting successive occurrences of the minimum run to five times, it is possible to reduce occurrences of such an error, and thus realize more stable recording and reproduction of data.

FIG. 15 is a block diagram showing an example of configuration of a personal computer performing the above-described series of processes by a program. A CPU (Central Processing Unit) 321 performs various processes according to a program stored in a ROM (Read Only Memory) 322 or a storage unit 328. A RAM (Random Access Memory) 323 stores the program executed by the CPU 321, data and the like as occasion demands. The CPU 321, the ROM 322, and the RAM 323 are interconnected via a bus 324.

The CPU 321 is also connected with an input-output interface 325 via the bus 324. The input-output interface 325 is connected with an input unit 326 formed by a keyboard, a mouse, a microphone and the like, and an output unit 327 formed by a display, a speaker and the like. The CPU 321 performs various processes in response to a command input from the input unit 326. The CPU 321 then outputs a result of a process to the output unit 327.

The storage unit 328 connected to the input-output interface 325 is formed by a hard disk, for example. The storage unit 328 stores programs to be executed by the CPU 321 and various data. A communication unit 329 communicates with external devices via networks such as the Internet, a local area network and the like. In addition, a program may be obtained via the communication unit 329 and then stored in the storage unit 328.

When removable media 331 such as a magnetic disk, an optical disk, a magneto-optical disk, a semiconductor memory and the like are loaded into a drive 330 connected to the input-output interface 325, the drive 330 drives these removable media 331, and obtains programs, data, and the like recorded on the removable media 331. The obtained programs and data are transferred to the storage unit 328 to be stored therein as occasion demands.

The series of processes described above can be carried out not only by hardware but also by software. When the series of processes is to be carried out by software, a program constituting the software is installed from a program storage medium onto a computer incorporated in special hardware, or for example a general-purpose personal computer that can perform various functions by installing various programs thereon.

As shown in FIG. 15, the program storage medium storing the program to be installed onto a computer and set in a state of being executable by the computer includes the removable media 331 as packaged media including a magnetic disk (including flexible disks), an optical disk (including CD-ROM (Compact Disk-Read Only Memory) and DVD (Digital Versatile Disk)), a magneto-optical disk (including MD (Mini-Disc) (registered trademark)), a semiconductor memory or the like, or includes the ROM 322, the hard disk forming the storage unit 328, or the like where the program is recorded temporarily or permanently. As occasion demands, the storing of the program on the program storage medium is performed via the communication unit 329 as an interface such as a router, a modem or the like using a wire or wireless communication medium such as a local area network, the Internet, digital satellite broadcasting or the like.

It is to be noted that in the present specification, the steps describing the program stored on the program storage medium include not only processes carried out in time series in the described order but also processes carried out in parallel or individually and not necessarily in time series.

It is to be noted that embodiments of the present invention are not limited to the foregoing embodiments, and that various changes can be made without departing from the spirit of the present invention.

What is claimed is:

1. A modulating device for converting data having a basic data length of m bits into variable length code (d, k; m, n) having a minimum run of d (d>0), a maximum run of k, and a basic codeword length of n bits, comprising:

a device for determining whether to perform substitution pattern conversion processing based on a substitution conversion table or to perform conversion processing based on a basic conversion table instead without performing the substitution pattern conversion processing, wherein the determination is made according to control information obtained from one of a data string and a variable length code string.

2. The modulating device according to claim 1,
wherein said substitution conversion table is a conversion table for limiting successive occurrences of the minimum run.

3. A modulating method for converting data having a basic data length of m bits into variable length code (d, m, n) having a minimum run of d (d>0), a maximum run of k, and a basic codeword length of n bits, comprising:
   determining whether to perform substitution pattern conversion processing based on a substitution conversion table or to perform conversion processing based on a basic conversion table instead without performing the substitution pattern conversion processing, wherein the determination is made according to control information obtained from one of a data string and a variable length code string.

4. A program stored in a machine readable storage device that is executed by a processor for converting data having a basic data length of m bits into variable length code (d, k; m, n) having a minimum run of d (d>0), a maximum run of k, and a basic codeword length of n bits, said program comprising:
   machine executable commands for automatically determining whether to perform substitution pattern conversion processing based on said substitution conversion table or to perform conversion processing based on said basic conversion table instead without performing the substitution pattern conversion processing, wherein the determination is made according to control information obtained from one of a data string and a variable length code string.

5. The program of claim 4, wherein the machine readable storage device is a flash memory.

6. A modulating device for converting data having a basic data length of m bits into variable length code (d, k; m, n) having a minimum run of d (d>0), a maximum run of k, and a basic codeword length of n bits, comprising:
   a device for determining whether to perform substitution pattern conversion processing based on a substitution conversion table or to perform conversion processing based on a basic conversion table instead without performing the substitution pattern conversion processing, wherein the determination is made according to information obtained from a disk.

7. The modulating device according to claim 6,
wherein said substitution conversion table is a conversion table for limiting successive occurrences of the minimum run.

8. The modulating device according to claim 6,
wherein the information obtained from said disk is predetermined header information recorded in a header position on said disk.

9. The modulating device according to claim 6,
wherein said modulating device determines whether to apply the substitution pattern conversion processing for limiting successive occurrences of the minimum run according to external information.

10. A modulating method for converting data having a basic data length of m bits into variable length code (d, k; m, n) having a minimum run of d (d>0), a maximum run of k, and a basic codeword length of n bits, said method comprising:
   determining whether to perform substitution pattern conversion processing based on a substitution conversion table or to perform conversion processing based on a basic conversion table instead without performing the substitution pattern conversion processing, according to information obtained from a disk.

11. A program recorded in a machine readable storage device that is executed by a processor for converting data having a basic data length of m bits into variable length code (d, m, n) having a minimum run of d (d>0), a maximum run of k, and a basic codeword length of n bits, said program comprising:
   commands for determining whether to perform substitution pattern conversion processing based on a substitution conversion table or to perform conversion processing based on a basic conversion table instead without performing the substitution pattern conversion processing, according to information obtained from a disk.

12. A program of claim 11 recorded in a flash memory.

13. A modulating device comprising:
   a first converting means for converting a part of input data which part matches a first data pattern into a corresponding first code pattern according to a first table;
   a second converting means for converting a part of the input data which part matches a second data pattern into a corresponding second code pattern according to a second table; and
   a means for selecting one of said first code pattern and said second code pattern on a basis of frequency of use of said second code pattern converted according to said second table.

14. The modulating device according to claim 13, further comprising detection processing means for detecting said frequency of use and generating control information for controlling selection of said second code pattern,
   wherein said means for selecting makes the selection on a basis of said control information.

15. The modulating device according to claim 14,
   wherein said detection processing means generates the control information for permitting conversion processing for said second code pattern when said frequency of use does not exceed a predetermined count set in advance, and prohibiting the conversion processing for said second code pattern when said frequency of use exceeds the predetermined count.

16. The modulating device according to claim 15,
   wherein said detection processing means sets said predetermined count such that said predetermined count is limited in a range in which error correction is possible.

17. The modulating device according to claim 16,
   wherein said detection processing means detects the frequency of use of said second code pattern within a predetermined ECC block, and limits said frequency of use such that said frequency of use does not exceed a predetermined reference value corresponding to a value within a range in which error correction is possible within said predetermined ECC block.

18. The modulating device according to claim 13,
   wherein said first table is a table corresponding to another table having reproduction compatibility.

19. The modulating device according to claim 18,
   wherein said first table includes all of a basic conversion table.

20. The modulating device according to, claim 19, wherein said first table further includes a substitution conversion table.

21. A modulating method comprising:

converting a part of input data which part matches a first data pattern into a corresponding first code pattern according to a first table;

converting a part of the input data which part matches a second data pattern into a corresponding second code pattern according to a second table; and selecting one of said first code pattern and said second code pattern on a basis of frequency of use of said second code pattern converted according to said second table.

22. A program recorded in a machine readable storage medium that is executed by a processor comprising:

commands for converting a part of input data which part matches a first data pattern into a corresponding first code pattern according to a first table;

commands for converting a part of the input data which part matches a second data pattern into a corresponding second code pattern according to a second table; and commands for selecting one of said first code pattern and said second code pattern on a basis of frequency of use of said second code pattern converted according to said second table.

23. A program of claim 22, wherein the program is recorded in a flash memory.

24. A modulating device comprising:

a first converter for converting a part of input data which part matches a first data pattern into a corresponding first code pattern according to a first table;

a second converter for converting a part of the input data which part matches a second data pattern into a corresponding second code pattern according to a second table; and a selector selecting one of said first code pattern and said second code pattern on a basis of frequency of use of said second code pattern.

* * * * *